US008645609B2

(12) United States Patent
Ko et al.

(10) Patent No.: US 8,645,609 B2
(45) Date of Patent: Feb. 4, 2014

(54) TWO-PORT MEMORY IMPLEMENTED WITH SINGLE-PORT MEMORY BLOCKS

(75) Inventors: Kung-Ling Ko, Union City, CA (US); Tony Sonthe Nguyen, San Jose, CA (US); Joseph Juh-En Cheng, Palo Alto, CA (US); Tuan Van Quach, San Jose, CA (US)

(73) Assignee: Brocade Communications Systems, Inc., San Jose, CA (US)

( * ) Notice: Subject to any disclaimer, the term of this patent is extended or adjusted under 35 U.S.C. 154(b) by 186 days.

(21) Appl. No.: 13/035,841

(22) Filed: Feb. 25, 2011

(65) Prior Publication Data

US 2012/0144103 A1 Jun. 7, 2012

Related U.S. Application Data

(60) Provisional application No. 61/420,176, filed on Dec. 6, 2010.

(51) Int. Cl.
*G06F 12/00* (2006.01)

(52) U.S. Cl.
USPC ........................ 711/5; 711/104; 711/E12.007

(58) Field of Classification Search
None
See application file for complete search history.

(56) References Cited

U.S. PATENT DOCUMENTS

| 4,660,177 | A | * | 4/1987 | O'Connor ..................... 365/156 |
| 4,722,047 | A | * | 1/1988 | Chan et al. .................... 711/202 |
| 4,736,436 | A | * | 4/1988 | Yasukawa et al. ............ 382/154 |
| 5,177,706 | A | * | 1/1993 | Shinohara et al. ....... 365/189.04 |
| 5,287,346 | A | * | 2/1994 | Bianchini et al. ............ 370/390 |
| 5,390,308 | A | * | 2/1995 | Ware et al. ...................... 711/5 |
| 5,440,713 | A | * | 8/1995 | Lin et al. ....................... 711/158 |
| 5,460,031 | A | * | 10/1995 | Fujishita et al. ......... 123/406.38 |
| 5,469,541 | A | * | 11/1995 | Kingman et al. ............. 345/545 |
| 5,583,803 | A | * | 12/1996 | Matsumoto et al. .......... 708/401 |
| 5,627,986 | A | * | 5/1997 | Frankland ......................... 711/5 |
| 5,732,041 | A | * | 3/1998 | Joffe ........................ 365/230.05 |
| 6,173,388 | B1 | * | 1/2001 | Abercrombie et al. ......... 712/22 |
| 7,237,059 | B2 | * | 6/2007 | Eatherton et al. ............. 711/108 |
| 2001/0046235 | A1 | * | 11/2001 | Trevitt et al. .................. 370/412 |
| 2002/0018359 | A1 | * | 2/2002 | Mizuno et al. ................ 365/154 |
| 2003/0053472 | A1 | * | 3/2003 | Trevitt et al. .................. 711/147 |
| 2003/0202405 | A1 | * | 10/2003 | Shau ............................. 365/200 |
| 2004/0111690 | A1 | * | 6/2004 | Reuland et al. ................. 716/17 |
| 2005/0180254 | A1 | * | 8/2005 | Tobescu et al. ............... 365/233 |
| 2005/0190736 | A1 | * | 9/2005 | Zory et al. .................... 370/342 |
| 2008/0056368 | A1 | * | 3/2008 | Togo ........................ 375/240.16 |
| 2008/0151670 | A1 | * | 6/2008 | Kawakubo et al. ........... 365/222 |
| 2010/0161892 | A1 | * | 6/2010 | Dama et al. ................... 711/104 |
| 2011/0302376 | A1 | * | 12/2011 | Zhou ............................. 711/149 |
| 2011/0310691 | A1 | * | 12/2011 | Zhou et al. ............... 365/230.03 |

* cited by examiner

*Primary Examiner* — Matthew Bradley
*Assistant Examiner* — Daniel Bernard
(74) *Attorney, Agent, or Firm* — Bever, Hoffman & Harms, LLP

(57) ABSTRACT

A two-port memory having a read port, a write port and a plurality of identical single-port RAM banks. The capacity of one of the single-port RAM banks is used to resolve collisions between simultaneous read and write accesses to the same single-port RAM bank. A read mapping memory stores instance information that maps logical banks and a spare bank to the single-port RAM banks for read accesses. Similarly, a write mapping memory stores write instance information that maps logical banks and a spare bank to the single-port RAM banks for write accesses. If simultaneous read and write accesses are not mapped to the same single-port RAM bank, read and write are performed simultaneously. However, if a collision exists, the write access is re-mapped to a spare bank identified by the write instance information, allowing simultaneous read and write. Both read and write mapping memories are updated to reflect any re-mapping.

33 Claims, 17 Drawing Sheets

FIG. 2

TWO-PORT MEMORY IMPLEMENTED WITH SINGLE-PORT MEMORY BLOCKS

RELATED APPLICATIONS

This application claims priority from U.S. Provisional Patent Application 61/420,176, entitled "Two Port eDRAM", which was filed on Dec. 6, 2010, and is incorporated by reference herein.

FIELD OF THE INVENTION

The present invention relates to a two-port random access memory (RAM) implemented using a plurality of single port memory banks.

RELATED ART

In networking switching ASICs, high memory throughput is required to sustain an acceptable packet processing rate. Moreover, a large memory space is required to hold a large number of packets to provide high quality of service.

To obtain a high memory throughput, a 2-port static random access memory (SRAM) is typically used. As defined herein, a 2-port memory includes a read port and a write port, wherein read operations can be performed from the read port, while write operations are simultaneously performed from the write port. Note that only read operations are allowed on the read port of the 2-port memory, and only write operations are allowed on the write port of the 2-port memory. A 2-port memory is different than a dual-port memory, in that both read and write operations are allowed on both ports of a dual-port memory.

The layout area of a 2-port SRAM is relatively large compared to the layout area of a 1-port SRAM of the same capacity. More specifically, the layout area of a 2-port SRAM is typically two times the layout area of a 1-port SRAM of the same capacity. Moreover, the layout area of a 2-port SRAM is potentially 3 to 4 times larger than the layout area of an enhanced dynamic random access memory (DRAM) of the same capacity. A 2-port SRAM having the capacity to store a large number of packets, as required by a network switching ASIC, will therefore undesirably consume a large layout area on this ASIC. As a result, the ASIC die may need to be made larger in order to accommodate the 2-port SRAM. Alternately, it may not be possible to fit a 2-port SRAM of the required capacity on an ASIC die of a particular size.

Accordingly, it would be desirable to have an improved 2-port memory that does not exhibit the relatively large layout area requirements of a 2-port SRAM.

SUMMARY

Accordingly, the present invention implements a two-port memory using a plurality of identical single-port random access memory (RAM) banks, wherein one of these single-port RAM banks is initially specified as a spare memory bank. The two-port memory includes a read port and a write port. When a write access (on the write port) specifies a first one of the single-port RAM banks and a simultaneous read access (on the read port) specifies a second (different) one of the single-port RAM banks, there is no collision between the write access and the read access. In this case, the write access and the read access are simultaneously performed, wherein the write access is performed to the first one of the single-port RAM banks and the read access is performed to the second one of the single-port RAM banks.

When a write access and a simultaneous read access specify the same single-port RAM bank (e.g., a 'first' single-port RAM bank), the read access is performed to the specified 'first' single-port RAM bank (i.e., the read access has priority over the write access), and the write access is performed to the specified spare memory bank, at an entry identified by a write address of the write access. In addition, the 'first' single-port RAM bank is re-specified (mapped) to become the spare memory bank for subsequent write accesses to the same entry. Moreover, the originally specified spare memory bank is re-specified (mapped) to become the 'first' single-port RAM bank for subsequent read accesses to the same entry. Mapping of the single-port RAM banks is implemented by two relatively small 2-port memories, which are associated with the read and write ports.

By controlling read and write accesses in this manner, simultaneous read and write accesses can be performed indefinitely on the read and write ports. Substantial area savings are realized by the two-port memory of the present invention, because area efficient single-port RAM memory is used as the main memory storage. In a particular embodiment, the single-port RAM banks are DRAM banks.

The present invention will be more fully understood in view of the following description and drawings.

BRIEF DESCRIPTION OF THE DRAWINGS

FIG. 2 is a block diagram that illustrates the entries of logical-to-physical (L2P) memory mapping SRAMs used in the two-port memory of FIG. 1, in accordance with one embodiment of the present invention.

DETAILED DESCRIPTION

Figure 1:
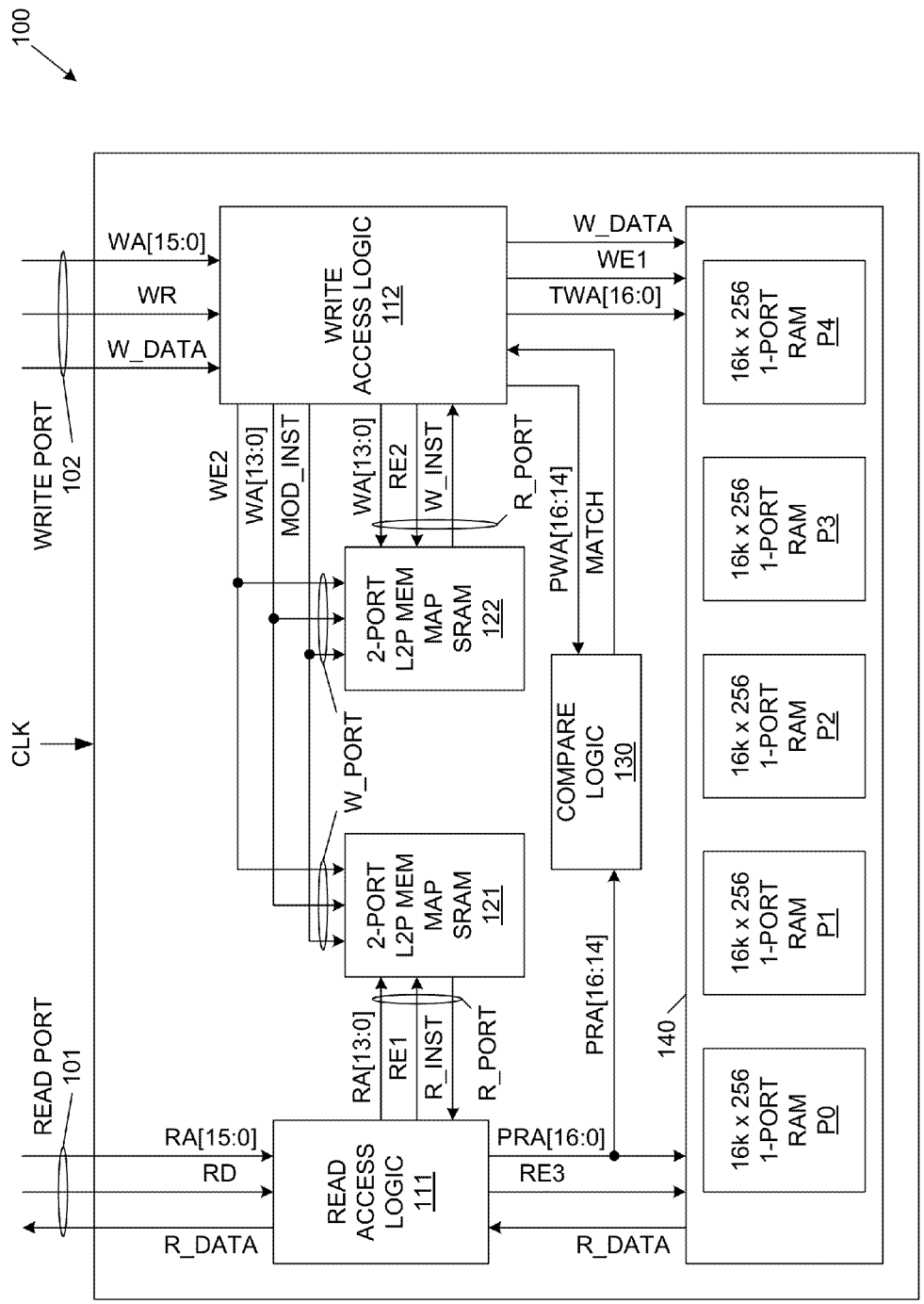
FIG. 1 is a block diagram of a two-port memory that is implemented using a plurality of single-port RAM banks in accordance with one embodiment of the present invention.

FIG. 1 is a block diagram of a two-port memory system 100 in accordance with one embodiment of the present invention. Memory system 100 includes read port 101, write port 102, read access logic 111, write access logic 112, 2-port logical-to-physical (L2P) memory mapping SRAMs 121-122, comparison logic 130, and main memory 140. Main memory 140 includes single-port RAM banks P0-P4. In one embodiment, single-port RAM banks P0-P4 are DRAM banks that implement DRAM storage cells. In an alternate embodiment, single port RAM banks P0-P4 are implemented by high-density SRAM storage cells. Note that implementing single-port RAM banks P0-P4 using DRAM cells advantageously provides a high density to main memory 140. Read accesses to main memory 140 are initiated on read port 101 and write accesses to main memory 140 are initiated on write port 102. In accordance with one embodiment, two-port memory system 100 operates in response to a clock signal (CLK), wherein simultaneous read and write accesses may be initiated on ports 101 and 102 during the same clock cycle. Each read access is initiated by activating a read enable signal RD and providing a logical read address RA[15:0] on the read port 101. Similarly, each write access is initiated by activating a write enable signal WR and providing a logical write address WA[15:0] and a corresponding write data value W_DATA on the write port 102.

Main memory 140 includes M identical single-port RAM banks, wherein M is equal to 5 in the illustrated example. In this example, three address bits are required to address the five single-port RAM banks P0-P4. M can have other values in other embodiments, wherein M is greater than or equal to two. In another embodiment, M is greater than or equal to three. In yet another embodiment, the number of single-port RAM banks M is equal to $2^P+1$, wherein P is a positive integer. Each of the single-port RAM banks P0-P4 includes N entries, wherein N is equal to 16K in the illustrated example. In this example, an entry within any one of the single-port RAM banks P0-P4 can be accessed by a 14-bit entry address value (e.g., RA[13:0] or WA[13:0]). Note that N can have other values in other embodiments, to provide the required storage capacity for main memory 140. Each of the N entries of each of the single-port RAM banks P0-P4 may store a corresponding data value. In the illustrated example, each entry is capable of storing a 256-bit data value (although other data widths are possible in other embodiments). As will become apparent in view of the following description, the actual storage capacity of main memory 140 (in number of entries) is equal to N*(M−1), because the capacity of one of the single-port RAM banks within main memory 140 enables "colliding" read and write accesses to be simultaneously processed within main memory 140. The total depth of main memory 140 is therefore 16K times 4, or 64K. Thus, in the illustrated example, memory system 100 emulates a 64K× 256 two-port memory.

Logical-to-physical (L2P) memory mapping SRAMs 121-122 are two-port memories, each of which includes N entries (N is equal to 16K in the illustrated example). As described in more detail below, write access logic 112 maintains identical entries in L2P memory mapping SRAMs 121 and 122. Each entry of L2P memory mapping SRAMs 121 and 122 identifies a correspondence between a logical bank address and a physical bank address. In the illustrated example, there are four logical bank addresses, which are specified by the two read address bits RA[15:14] or the two write address bits WA[15:14]. The four logical memory banks associated with the four logical bank addresses are hereinafter referred to as logical memory banks L0-L3. In the examples described herein, the logical memory banks L0, L1, L2 and L3 are assigned the logical bank addresses '00', 01', '10' and '11', respectively.

Each of the five single-port RAM banks P0-P4 is assigned a physical bank address. As described above, each of the physical bank addresses is represented by a 3-bit value. In the examples described herein, the single-port RAM banks P0, P1, P2, P3 and P4 are assigned physical bank addresses '000', '001', '010', '011' and '100', respectively.

Figure 2:
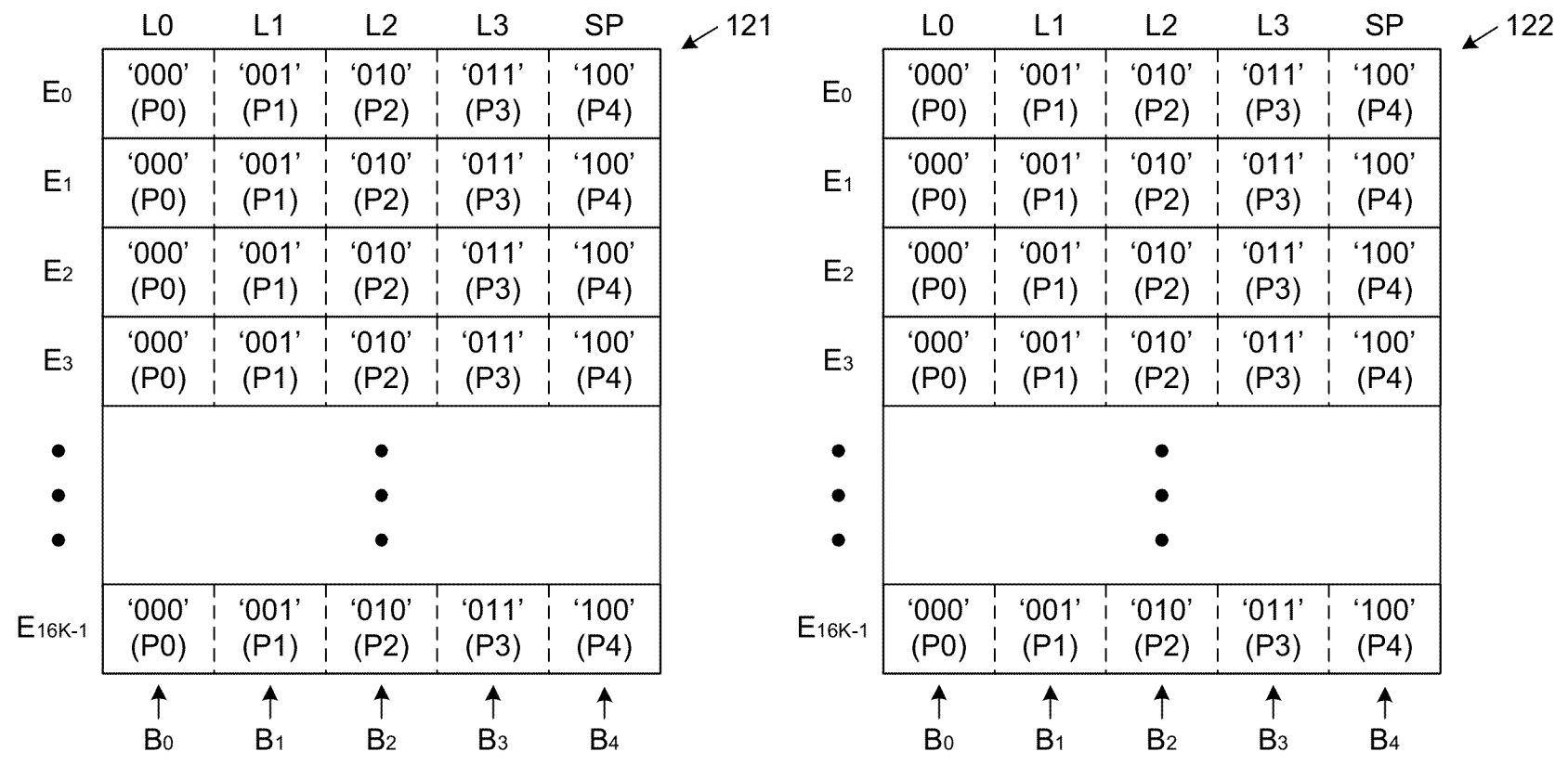

FIG. 2 is a block diagram that illustrates the 16K entries $E_0$ to $E_{16K-1}$ of L2P memory mapping SRAMs 121-122, in accordance with one embodiment of the present invention. Each entry includes five bytes $B_0$, $B_1$, $B_2$, $B_3$ and $B_4$, wherein the first byte $B_0$ stores the physical bank address of the single-port RAM bank that is mapped to the first logical memory bank L0; the second byte $B_1$ stores the physical bank address of the single-port RAM bank that is mapped to the second logical memory bank L1; the third byte $B_2$ stores the physical bank address of the single-port RAM bank that is mapped to the third logical memory bank L2; the fourth byte $B_3$ stores the physical bank address of the single-port RAM bank that is mapped to the fourth logical memory bank L3; and the fifth byte $B_4$ stores the physical bank address of the single port RAM bank that is specified as the spare memory bank (SP) for the particular entry.

As illustrated in FIG. 2, the L2P memory mapping SRAMs 121-122 are initially programmed such that the logical memory banks L0, L1, L2 and L3 are initially mapped to the single-port RAM banks P0, P1, P2 and P3, respectively, for each of the N entries. In addition, the single-port RAM bank P4 is initially designated as the spare memory bank for each of the N entries. The contents of each entry of the L2P memory mapping SRAMs 121-122 are hereinafter referred to as "instance information", because each entry indicates which instances of the single-port RAM banks P0-P4 are mapped to the logical memory banks L0-L3.

Memory system 100 operates as follows in accordance with one embodiment of the present invention. In response to receiving a read access request on the read port 101, read access logic 111 retrieves instance information (R_INST) from L2P memory mapping SRAM 121. More specifically, read access logic 111 activates a read enable signal RE1 (in response to the activated RD signal) and transmits the entry address portion of the logical read address (i.e., RA[13:0]) to the read port (R_PORT) of L2P memory mapping SRAM 121. In response, L2P memory mapping SRAM 121 provides the entry specified by the read entry address RA[13:0] as the read instance information (R_INST).

Read access logic 111 decodes the retrieved read instance information (R_INST) to identify which of the single-port RAM banks P0-P4 is mapped to the logical memory bank specified by the logical read address RA[15:14]. For example, if the logical read address bits RA[15:14] specify the logical memory bank L0 (i.e., RA[15:14]='00'), then read access logic 111 will retrieve the physical bank address from the first byte $B_0$ of the retrieved instance information. Thus, immediately after initialization (FIG. 2), the read access logic 111 would retrieve the physical bank address (e.g., '000') assigned to single-port RAM bank P0.

Read access logic 111 uses the physical bank address retrieved from the read instance information R_INST to translate the logical read address RA[15:0] to a physical read address PRA[16:0]. The physical read address PRA[16:0] includes the physical bank address retrieved from the read instance information R_INST as bits PRA[16:14], and the read address bits RA[13:0] as bits PRA[13:0].

Read access logic 111 provides the physical read bank address bits PRA[16:14] to comparison logic 130. As described in more detail below, comparison logic 130 compares the physical read bank address PRA[16:14] with a physical write bank address (described below) to determine whether there is a collision between the read access and a simultaneous write access.

Read access logic 111 also provides the physical read address PRA[16:0] to main memory 140 and activates a read enable signal RE3. Under these conditions, a read access is performed within the single-port RAM bank specified by the physical read bank address PRA[16:14], from the entry specified by the read entry address PRA[13:0]. The corresponding read data value R_DATA is routed from the accessed single-port RAM bank to read access logic 111. Read access logic 111 sends the read data value R_DATA to read port 101, thereby completing the read access.

In the described examples, read accesses have priority over write accesses, such that read accesses are always performed to the single-port RAM bank specified by the physical read bank address PRA[16:14], without delay or re-mapping. As described in more detail below, collisions between simultaneous read and write accesses that specify the same single-port RAM bank are resolved by re-mapping the write access.

A write access to memory system 100 is performed as follows. In response to receiving a write access request on the write port 102, write access logic 112 retrieves instance information (W_INST) from L2P memory mapping SRAM 122. More specifically, write access logic 112 activates a read enable signal RE2 (in response to the activated WR signal) and transmits the entry address portion of the logical write address (i.e., WA[13:0]) to the read port (R_PORT) of L2P memory mapping SRAM 122. In response, L2P memory mapping SRAM 122 provides the entry specified by the write address WA[13:0] as the write instance information (W_INST).

Write access logic 112 decodes the retrieved write instance information (W_INST) to identify which one of the single-port RAM banks P0-P4 is mapped to the logical memory bank specified by the logical write address WA[15:14]. For example, if the logical write address bits WA[15:14] specify the logical memory bank L2 (i.e., WA[15:14]='10'), then write access logic 112 will retrieve the physical bank address from the third byte $B_2$ of the retrieved write instance information. Thus, immediately after initialization (FIG. 2), the write access logic 112 would retrieve the physical bank address (e.g., '010') assigned to single-port RAM bank P2. This retrieved physical write bank address, which is labeled PWA[16:14] in FIG. 1, is provided to comparison logic 130.

During each access cycle, comparison logic 130 compares the physical write bank address PWA[16:14] received from write access logic 112 with the physical read bank address PRA[16:14] received from read access logic. If a match is detected, indicating that the read access and the write access are attempting to access the same physical memory bank within main memory 140, then comparison logic 130 activates a MATCH control signal. If no match is detected, comparison logic 130 deactivates the MATCH control signal.

The MATCH control signal is provided to write access logic 112. If the MATCH control signal has a deactivated state (indicating no collision), then write access logic 112 uses the physical bank address PWA[16:14] previously retrieved from the write instance information W_INST to perform a write access to main memory 140. More specifically, write access logic 112 provides a translated physical write address TWA[16:0] to main memory 140, wherein TWA[16:14] is equal to the previously retrieved physical bank address PWA[16:14], and TWA[13:0] is equal to the write entry address bits WA[13:0]. Write access logic 112 also activates a write enable signal WE1, which is provided to main memory 104, and also provides the write data value W_DATA to main memory 104. Under these conditions, main memory 104 writes the write data value W_DATA to the single-port RAM bank specified by the physical write address PWA[16:14] (e.g., bank P2), at the entry specified by the write entry address WA[13:0]. Note that this write access can be performed in parallel with the associated read access because these accesses occur in different ones of the single-port RAM banks P0-P4.

If the MATCH control signal is activated by collision logic 130 (indicating a collision between the write access and a simultaneous read access), then write access logic 112 uses the previously retrieved write instance information W_INST to generate a translated physical write address TWA[16:0] for the write access, thereby eliminating the collision. More specifically, write access logic accesses the fifth byte $B_4$ of the retrieved write instance information W_INST to determine which one of the single-port RAM banks P0-P4 is currently specified as the spare memory bank for the entry to be written. For example, immediately after initialization (FIG. 2), the write instance information W_INST of each of the entries indicates that the single-port RAM bank P4 is specified as the spare memory bank (i.e., byte $B_4$='100'). Write access logic 112 generates the translated physical write address TWA[16:0], such that TWA[16:14] is equal to the address of the spare memory bank, and TWA[13:0] is equal to the write entry address WA[13:0]. Write access logic 112 provides the translated physical write address TWA[16:0], along with the write data value W_DATA and the activated write enable signal WE1 to main memory 104. In response, main memory 104 writes the write data value W_DATA to the spare memory bank specified by the translated physical write address bits TWA[16:14] (e.g., bank P4), at the entry specified by the translated physical write address bits TWA[13:0]. The write access can be performed in parallel with the associated read access because these accesses are performed in different ones of the single-port RAM banks P0-P4.

If the MATCH control signal is activated by collision logic 130 (indicating a collision), then write access logic 112 also updates the read and write instance information for the entry specified by the write access (i.e., the entry specified by the write address bits WA[13:0]). That is, the read and write instance information is updated to reflect a new spare bank for the entry specified by the write access. More specifically, write access logic 112 modifies the write instance information W_INST as follows. The byte of the write instance information W_INST associated with the logical write bank address WA[15:14], and the byte $B_4$ of the write instance information W_INST associated with the spare memory bank are swapped, thereby creating modified instance information MOD_INST. For example, assume a read access and a simultaneous write access collide, and the write access specifies the logical bank address L0 (i.e., byte $B_0$ of the write instance information). Further assume that the byte $B_0$ identifies the single-port memory bank P0 (i.e., $B_0$='000'). As described above, byte $B_4$ of the write instance information W_INST specifies the spare memory bank. Assume that the byte $B_4$ identifies the single port memory bank P4 (i.e., $B_4$='100'). In this case, write access logic 112 would swap the bytes $B_0$ and $B_4$ of the write instance information W_INST to create the modified instance information MOD_INST. As a result, byte $B_4$ of the modified instance information MOD_INST would be equal to '000', thereby indicating that the single-port RAM bank P0 has become the spare memory bank for the associated entry. Similarly, byte $B_0$ of the modified instance information MOD_INST would be equal to '100', thereby indicating that the single-port RAM bank P4 has become the logical memory bank L0 for this entry.

Write access logic 112 writes the modified instance information MOD_INST to L2P memory mapping SRAMs 121 and 122, at the entry specified by the write entry address WA[13:0]. More specifically, write access logic 112 provides the modified instance information MOD_INST and the write entry address WA[13:0] to the write ports (W_PORT) of L2P memory mapping SRAMs 121-122, and activates a corresponding write enable signal WE2 to initiate these write operations. In the described example, write access logic 112 writes the modified instance information MOD_INST to L2P memory mapping SRAMs 121-122 at the same time that the write data value W_DATA is written to main memory 140 and the read data value R_DATA is read from main memory 140. Because the same entries of L2P memory mapping SRAMs 121 and 122 are updated with the same modified instance information MOD_INST, the contents of these SRAMs 121 and 122 are identical during normal operation of memory system 100.

An exemplary sequence of read and write accesses will now be described in detail, thereby further clarifying the operation of memory system 100. FIGS. 3, 4, 5, 6A-6C, 7A-7C, 8A-8C and 9A-9C illustrate a sequence of specific read and write operations, which are performed in accordance with one embodiment of the present invention.

Figure 3:
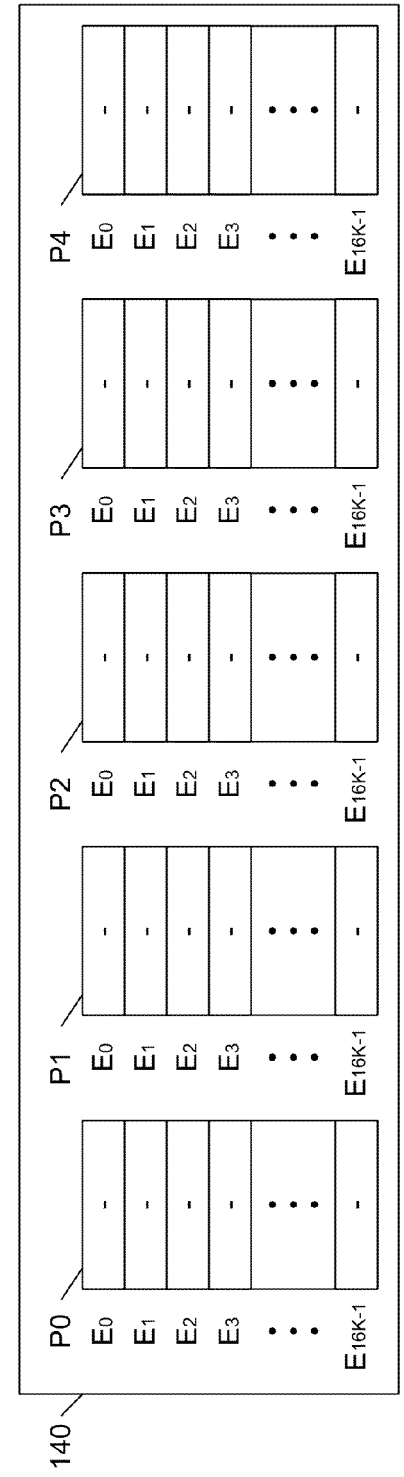
FIG. 3 is a block diagram that illustrates the contents of L2P memory mapping SRAMs and single-port RAM banks of the two-port memory of FIG. 1 immediately after initialization, in accordance with one embodiment of the present invention.

FIG. 3 is a block diagram that illustrates the contents of L2P memory mapping SRAMs 121-122 and the contents of single-port RAM banks P0-P4 of main memory 140 immediately after initialization, in accordance with one embodiment of the present invention. As illustrated in FIG. 3, the L2P memory mapping SRAMs 121-122 store the same values described above in connection with FIG. 2. Note that the 3-bit binary physical bank address values of FIG. 2 are replaced by the corresponding integers in FIG. 3 (for clarity). Thus, logical memory banks L0-L3 are mapped to single-port RAM banks P0-P3, respectively, and the spare memory bank is mapped to single-port RAM bank P4. All entries of single-port RAM banks P0-P4 are initially empty (or invalid).

Figure 4:
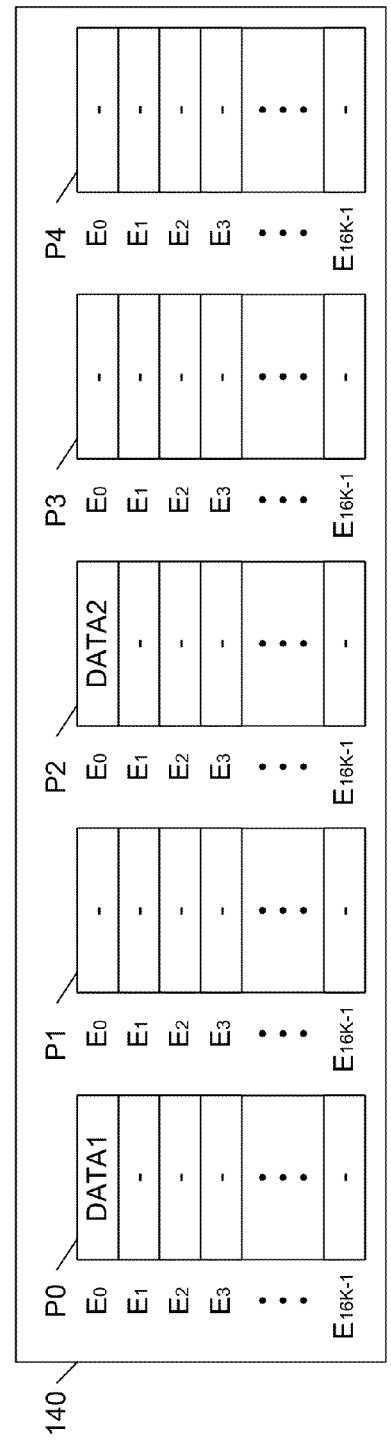
FIG. 4 is a block diagram that illustrates the contents of L2P memory mapping SRAMs and single-port RAM banks of the two-port memory of FIG. 1, after a pair of data values DATA1 and DATA 2 have been written to the single-port RAM banks.

FIG. 4 is a block diagram that illustrates the contents of L2P memory mapping SRAMs 121-122 and single-port RAM banks P0-P4 after a data value DATA1 has been written to entry $E_0$ of single-port RAM bank P0, and a data value DATA2 has been written to entry $E_0$ of single-port RAM bank P2. These write accesses are performed without any collisions with read accesses, such that the contents of L2P memory mapping SRAMs 121-122 remain unchanged from FIG. 3. Note that if no collision exists between a read access and a corresponding write access, the instance information stored by L2P memory mapping SRAMs 121-122 will not be modified.

Figure 5:
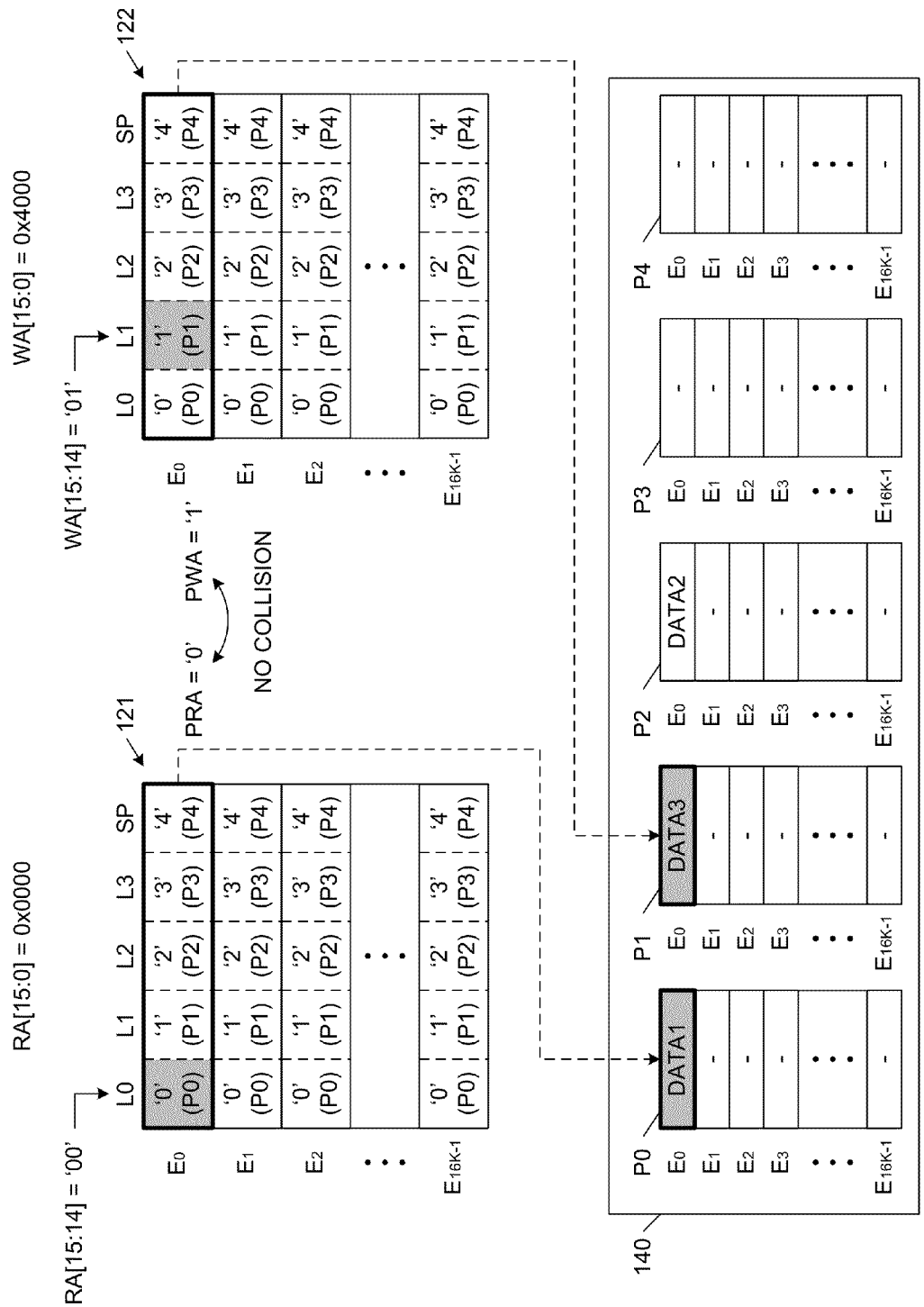
FIG. 5 is a block diagram that illustrates the contents of L2P memory mapping SRAMs and single-port RAM banks of the two-port memory of FIG. 1, after non-colliding read and write accesses are implemented.

FIG. 5 is a block diagram that illustrates the contents of L2P memory mapping SRAMs 121-122 and single-port RAM banks P0-P4, after a read access to logical read address 0x0000 and a simultaneous write access to logical write address 0x4000. Read access logic 111 retrieves the read instance information from entry $E_0$ of L2P memory mapping SRAM 121 in response to the logical read entry address RA[13:0], in the manner described above. Read access logic 111 decodes this retrieved entry $E_0$ to determine that the read access specifies single-port RAM bank P0 (i.e., logical read address RA[15:14]='00'=logical memory bank L0=byte $B_0$=physical bank P0).

Similarly, write access logic 112 retrieves the write instance information from entry $E_0$ of L2P memory mapping SRAM 122 in response to the logical write entry address WA[13:0], in the manner describe above. Write access logic 112 decodes this retrieved entry $E_0$ to determine that the write access specifies single-port RAM bank P1 (i.e., logical write address WA[15:14]='01'=logical memory bank L2=byte $B_1$=physical bank P1). Collision logic 130 determines that no collision exists between the read and write accesses. As a result, the read access is performed to single-port RAM bank P0, while the write access is simultaneously performed to single-port RAM bank P1. More specifically, read access logic 111 reads the data value DATA1 from entry $E_0$ of single-port RAM bank P0, while write access logic 112 writes the data value DATA3 to entry $E_0$ of single-port RAM bank P1. Because no collision was detected, the contents of L2P memory mapping SRAMs 121-122 are not modified.

Figure 6A:
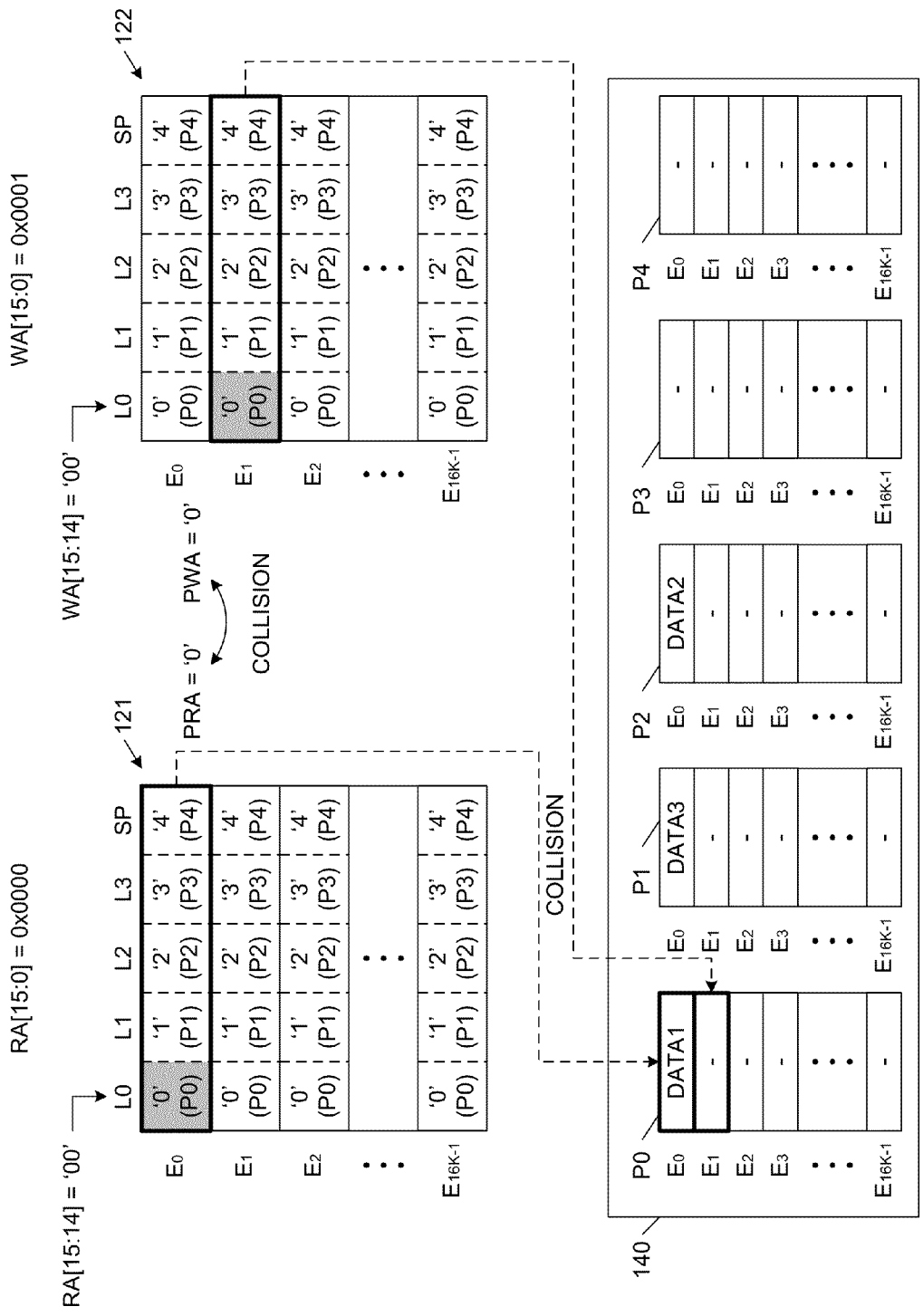
FIGS. 6A, 6B and 6C are block diagrams that illustrate the contents of L2P memory mapping SRAMs and single-port RAM banks of the two-port memory of FIG. 1 during the processing of a first colliding pair of read and write accesses.
Figure 6B:
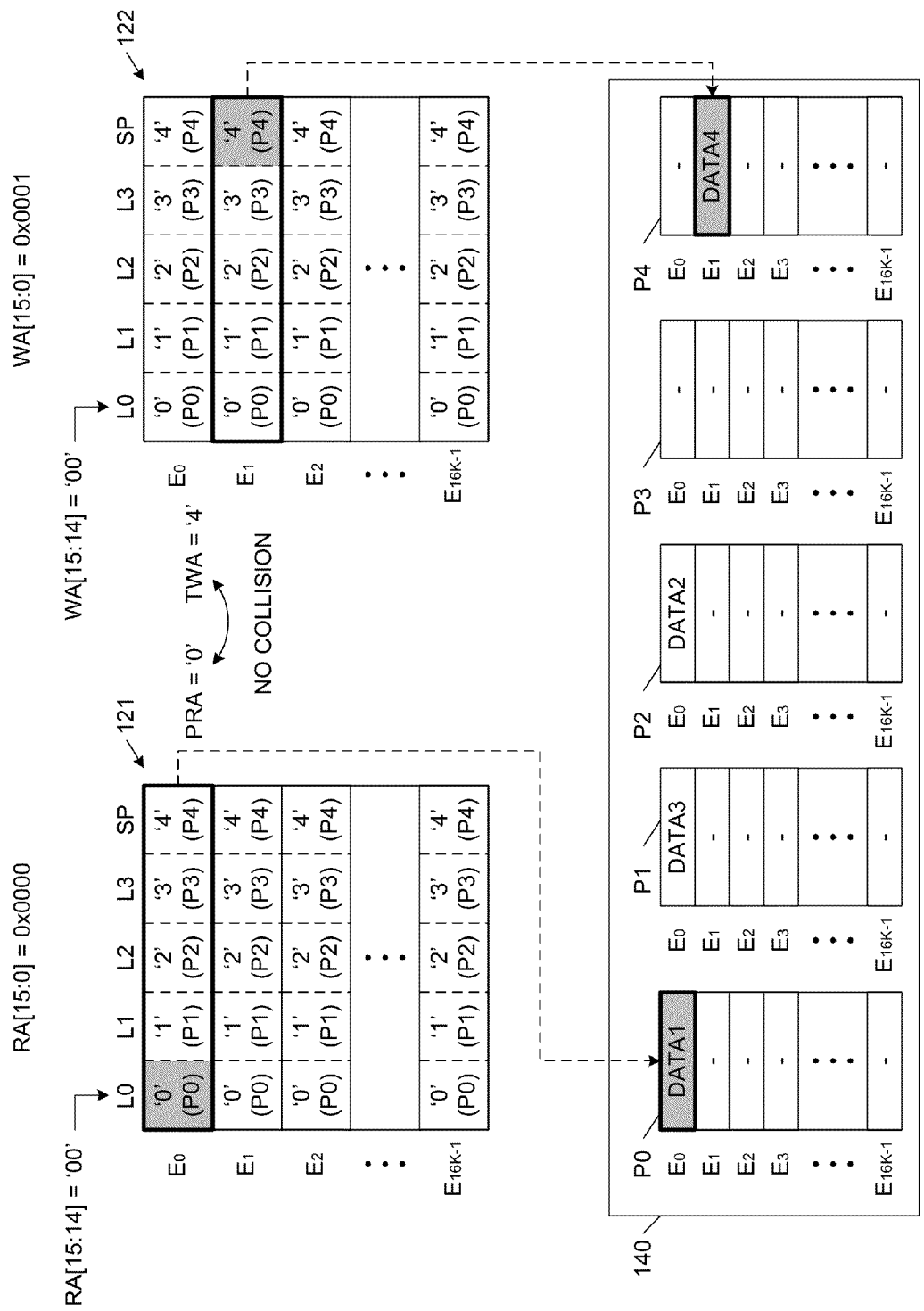
Figure 6C:
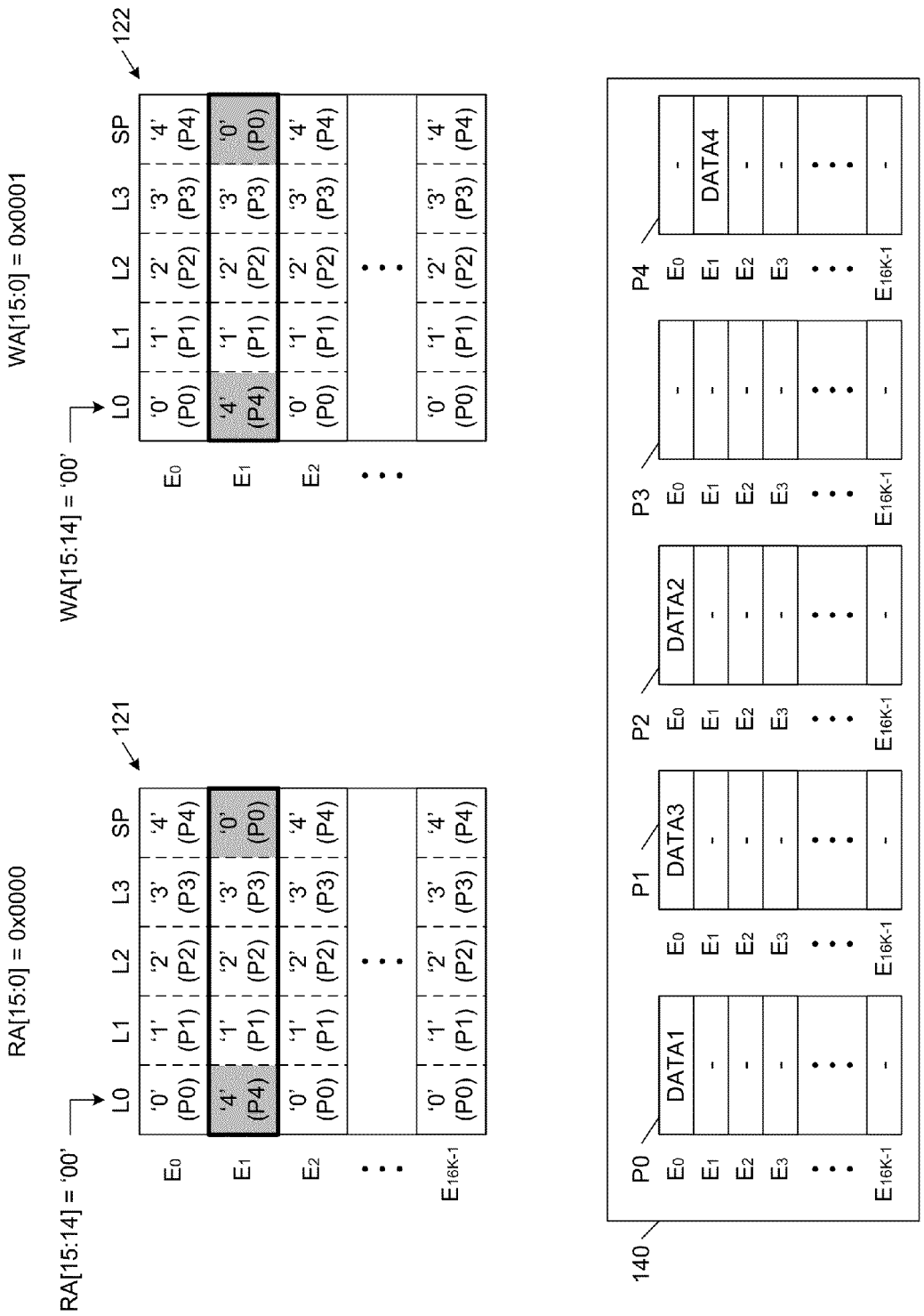

FIGS. 6A-6C are block diagrams that illustrate L2P memory mapping SRAMs 121-122 and single-port RAM banks P0-P4, for a read access to logical read address 0x0000 and a simultaneous write access to logical write address 0x0001. As illustrated in FIG. 6A, read access logic 111 retrieves the read instance information from entry $E_0$ of L2P memory mapping SRAM 121 in response to the logical read entry address RA[13:0], in the manner described above. Read access logic 111 decodes this retrieved entry $E_0$ to determine that the read access specifies single-port RAM bank P0 (i.e., logical read address RA[15:14]='00'=logical memory bank L0=byte $B_0$=physical bank P0).

Similarly, write access logic 112 retrieves the write instance information from entry $E_1$ of L2P memory mapping SRAM 122 in response to the logical write entry address WA[13:0], in the manner describe above. Write access logic 112 decodes this retrieved entry $E_1$ to determine that the write access specifies single-port RAM bank P0 (i.e., logical write address WA[15:14]='00'=logical memory bank L0=byte $B_0$=physical bank P0). Collision logic 130 determines that a collision exists between the read and write accesses.

As illustrated in FIG. 6B, the read access has a higher priority when there is a collision, so read access logic 111 is allowed to read the data value DATA1 from entry $E_0$ of single-port RAM bank P0. Write access logic 112 identifies the single-port RAM bank P4 as the spare memory bank from the retrieved write instance information (i.e., byte $B_4$=physical bank P4). Write access logic 112 then writes the data value DATA4 of the write access to entry $E_1$ of this 'spare' single-port RAM bank P4. The read access from single-port RAM bank P0 may be performed in parallel with the write access to single-port RAM bank P4, because no collision exists for these accesses.

As illustrated in FIG. 6C, the contents of L2P memory mapping SRAMs 121-122 are updated to properly reflect the resolution of the collision. More specifically, entries $E_1$ of L2P memory mapping SRAMs 121 are 122 are updated such that byte $B_0$ of these entries stores a value of '4', and byte $B_4$ of these entries stores a value of '0'. This update properly reflects the fact that a subsequent read access to entry $E_1$ of logical memory bank L0 should be mapped to single-port RAM bank P4 (note that data value DATA4 is stored in entry $E_1$ of bank P4). This update also properly reflects the fact that single-port RAM bank P0 has now become the spare memory bank for entry $E_1$. Note that even though single-port SRAM bank P4 started out as the spare memory bank for entry $E_1$, it is understood that any of the RAM banks P0-P4 can become the spare memory bank for this entry $E_1$ (or any entry) at any time.

Figure 7A:
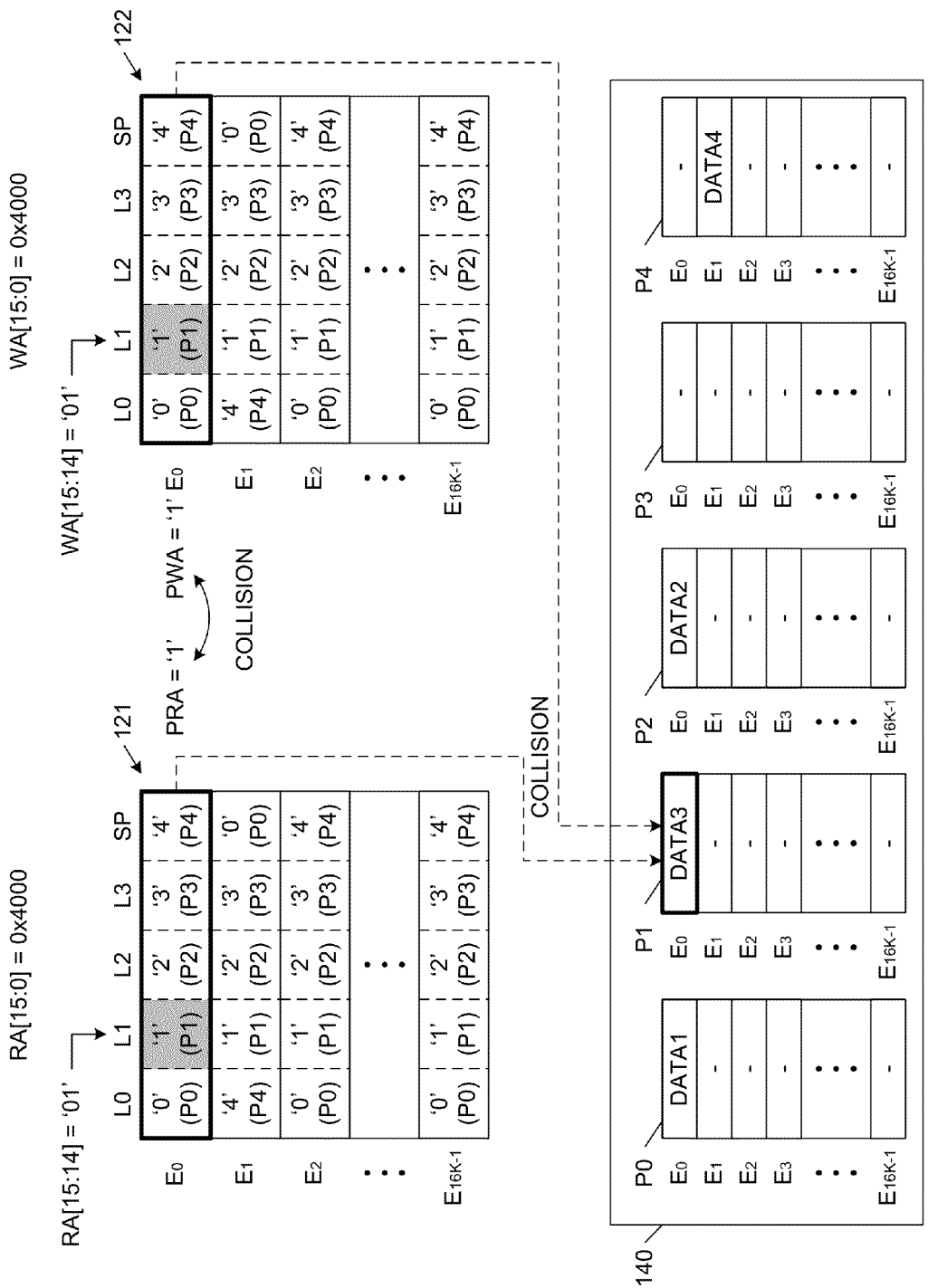
FIGS. 7A, 7B and 7C are block diagrams that illustrate the contents of L2P memory mapping SRAMs and single-port RAM banks of the two-port memory of FIG. 1 during the processing of a second colliding pair of read and write accesses.
Figure 7B:
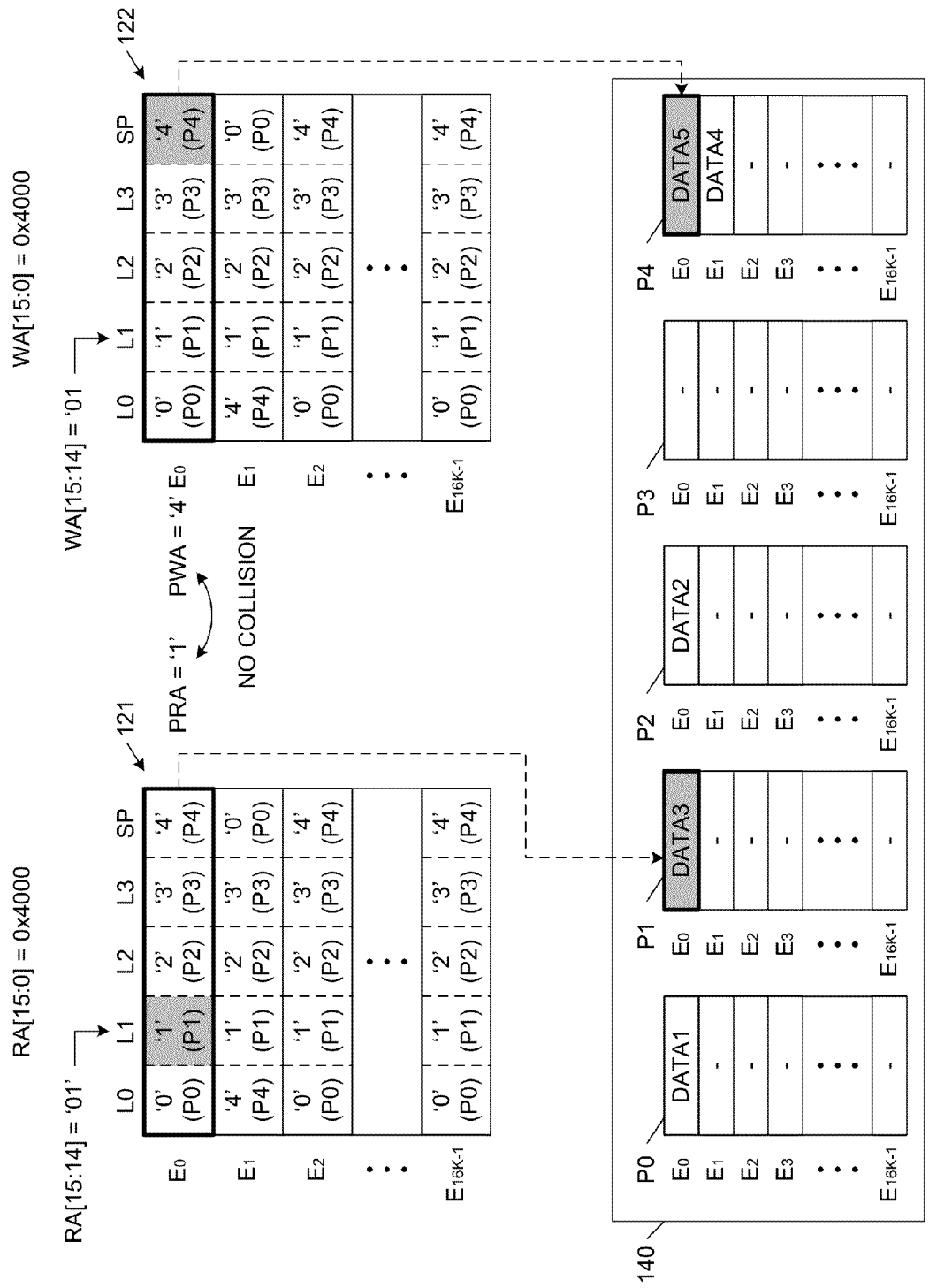
Figure 7C:
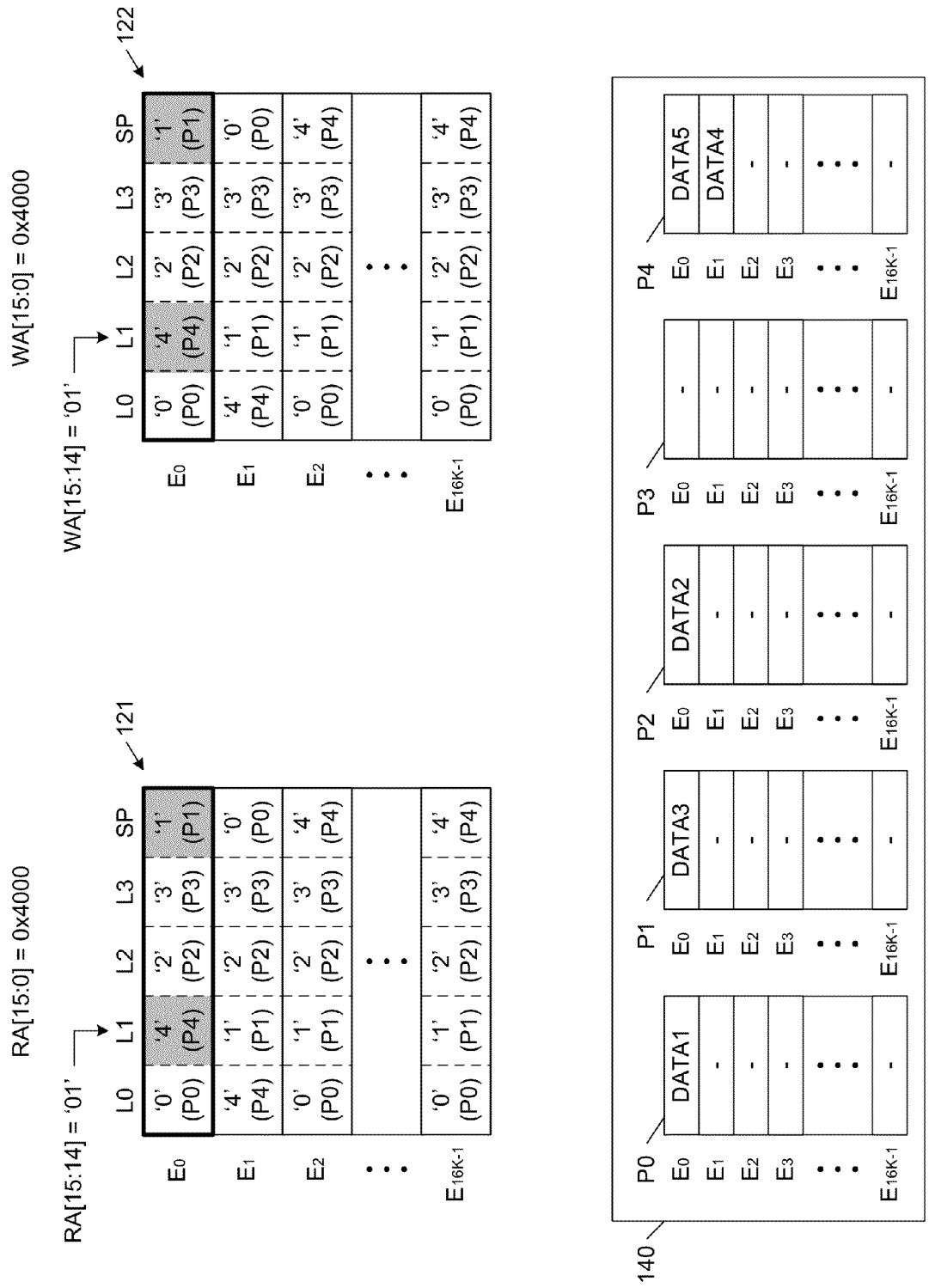

FIGS. 7A-7C are block diagrams that illustrate L2P memory mapping SRAMs 121-122 and single-port RAM banks P0-P4, for a read access to logical read address 0x4000 and a simultaneous write access to logical write address 0x4000. As illustrated in FIG. 7A, read access logic 111 retrieves the read instance information from entry $E_0$ of L2P memory mapping SRAM 121 in response to the logical read entry address RA[13:0]. Read access logic 111 decodes this retrieved entry $E_0$ to determine that the read access specifies single-port RAM bank P1 (i.e., logical read address RA[15: 14]='01'=logical memory bank L1=byte $B_1$=physical bank P1).

Similarly, write access logic 112 retrieves the write instance information from entry $E_0$ of L2P memory mapping SRAM 122 in response to the logical write entry address WA[13:0]. Write access logic 112 decodes this retrieved entry $E_0$ to determine that the write access specifies single-port RAM bank P1 (i.e., logical write address WA[15:14]= '01'=logical memory bank L1=byte $B_1$=physical bank P1). Collision logic 130 determines that a collision exists between the read and write accesses.

As illustrated in FIG. 7B, the read access has a higher priority when there is a collision, so read access logic 111 is allowed to read the data value DATA3 from entry $E_0$ of single-port RAM bank P1. Write access logic 112 identifies the single-port RAM bank P4 as the spare memory bank from the retrieved write instance information (i.e., byte $B_4$ identifies physical bank P4). Write access logic 112 then writes the data value DATA5 of the write access to entry $E_0$ of this 'spare' single-port RAM bank P4. The read access from single-port RAM bank P1 may be performed in parallel with the write access to single-port RAM bank P4, because no collision exists for these accesses.

As illustrated in FIG. 7C, the contents of L2P memory mapping SRAMs 121-122 are updated to properly reflect the resolution of the collision. More specifically, entries $E_0$ of L2P memory mapping SRAMs 121 are 122 are updated such that byte $B_1$ of these entries stores a value of '4', and byte $B_4$ of these entries stores a value of '1'. This update properly reflects the fact that a subsequent read access to entry $E_0$ of logical memory bank L1 should be mapped to single-port RAM bank P4 (note that data value DATA5 is stored in entry $E_0$ of bank P4). This update also properly reflects the fact that single-port RAM bank P1 has now become the spare memory bank for entry $E_0$. Note that different ones of the single-port SRAM banks P0-P4 can simultaneously be the spare memory banks for different entries. In the example of FIG. 7C, single-port SRAM bank P1 is the spare bank for entry $E_0$, while single port SRAM bank P0 is the spare memory bank for entry $E_1$.

Figure 8A:
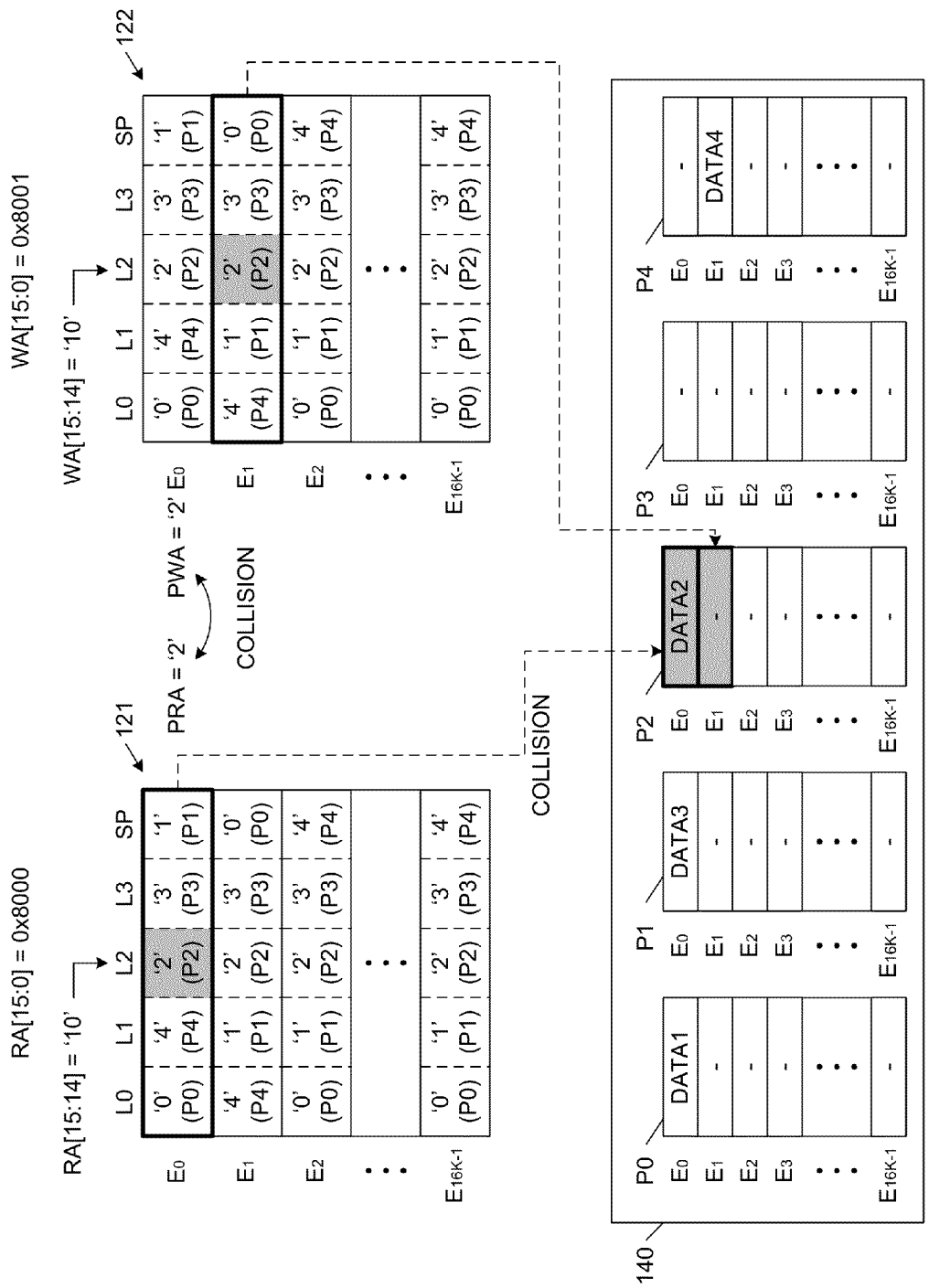
FIGS. 8A, 8B and 8C are block diagrams that illustrate the contents of L2P memory mapping SRAMs and single-port RAM banks of the two-port memory of FIG. 1 during the processing of a third colliding pair of read and write accesses.
Figure 8B:
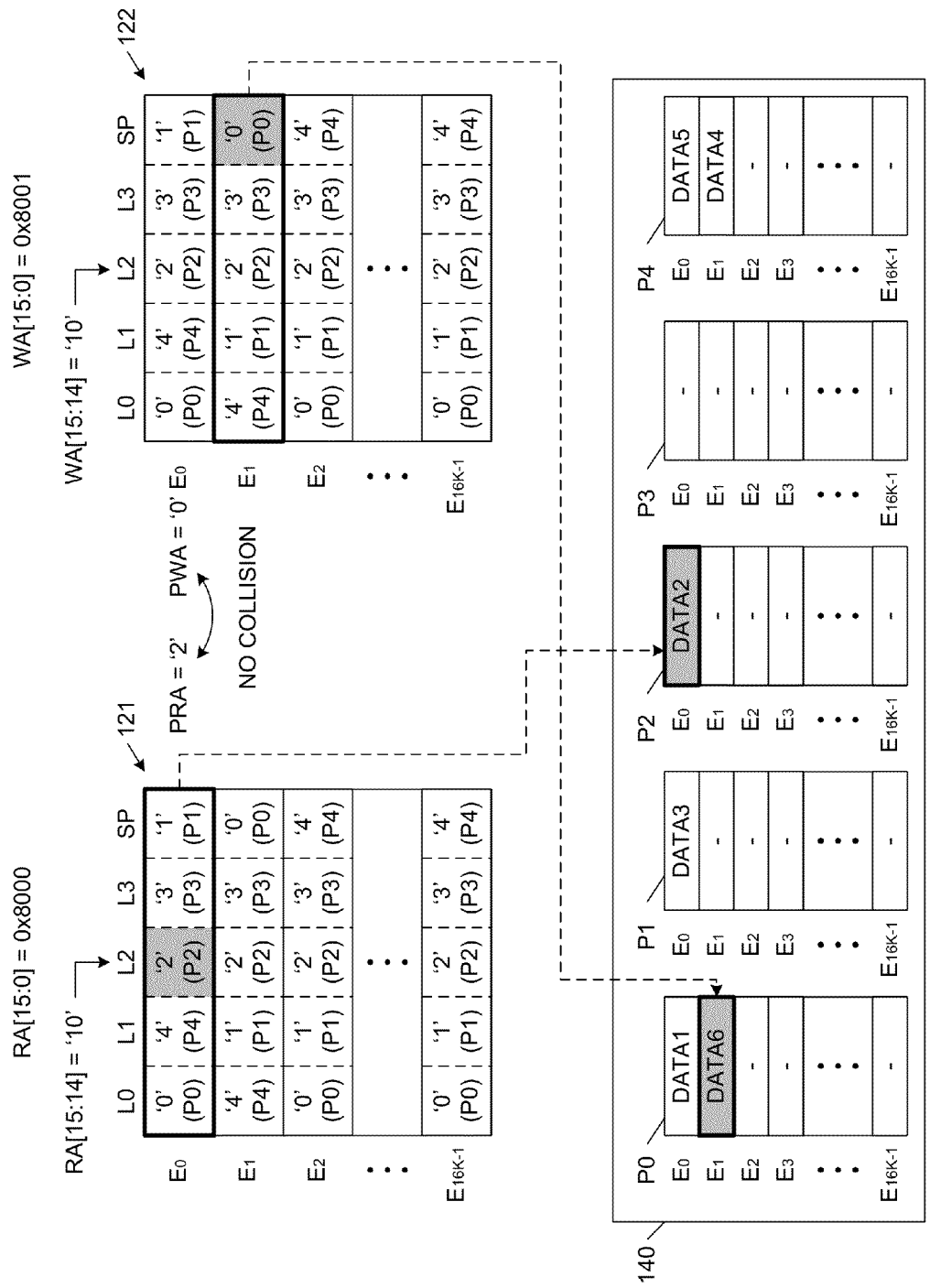
Figure 8C:
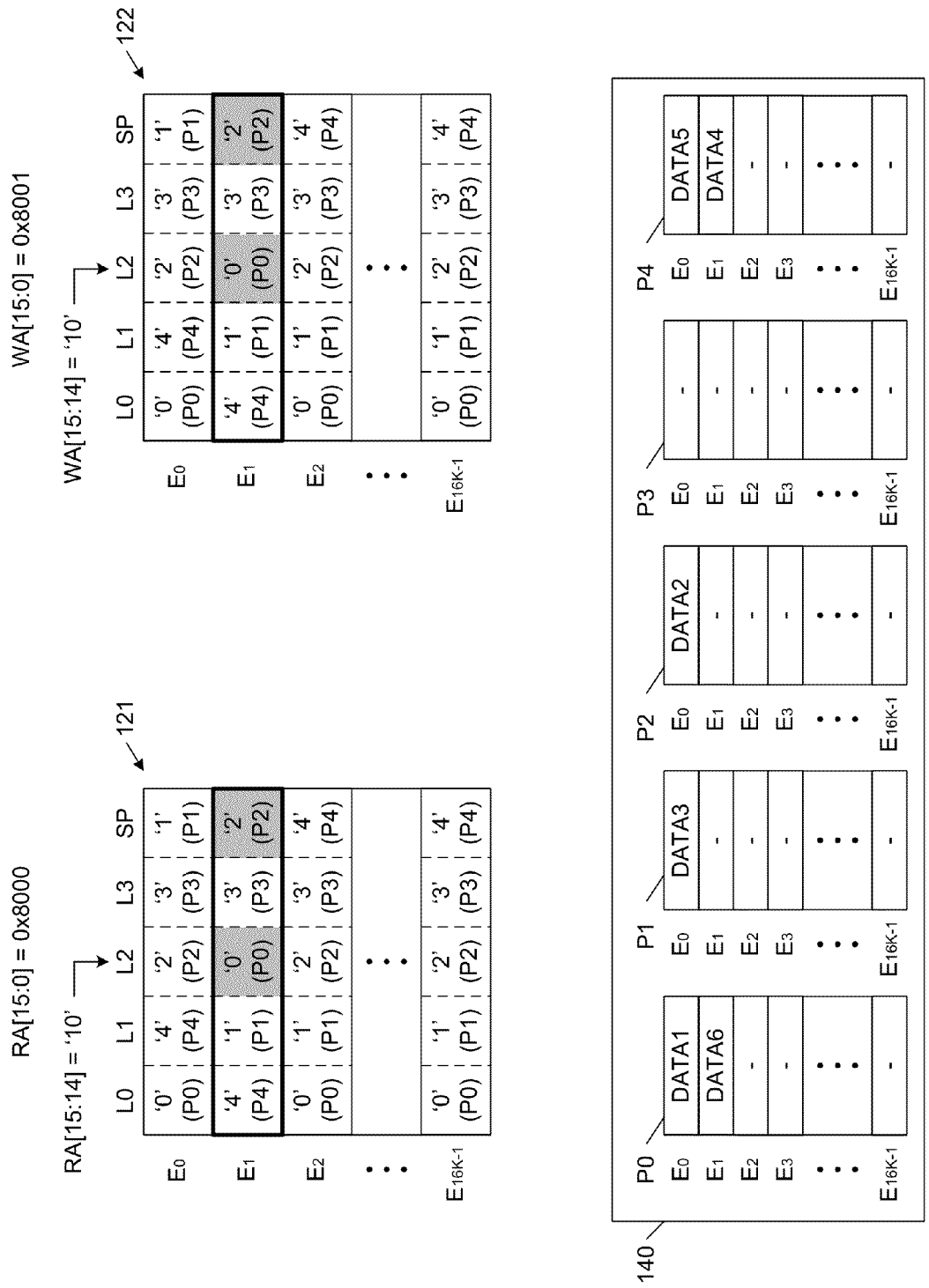

FIGS. 8A-8C are block diagrams that illustrate L2P memory mapping SRAMs 121-122 and single-port RAM banks P0-P4, for a read access to logical read address 0x8000 and a simultaneous write access to logical write address 0x8001. As illustrated in FIG. 8A, read access logic 111 retrieves the read instance information from entry $E_0$ of L2P memory mapping SRAM 121 in response to the logical read entry address RA[13:0]. Read access logic 111 decodes this retrieved entry $E_0$ to determine that the read access specifies single-port RAM bank P2 (i.e., logical read address RA[15: 14]='10'=logical memory bank L2=byte $B_2$=physical bank P2).

Similarly, write access logic 112 retrieves the write instance information from entry $E_1$ of L2P memory mapping SRAM 122 in response to the logical write entry address WA[13:0]. Write access logic 112 decodes this retrieved entry $E_1$ to determine that the write access specifies single-port RAM bank P2 (i.e., logical write address WA[15:14]= '10'=logical memory bank L2=byte $B_2$=physical bank P2). Collision logic 130 determines that a collision exists between the read and write accesses.

As illustrated in FIG. 8B, the read access has a higher priority when there is a collision, so read access logic 111 is allowed to read the data value DATA2 from entry $E_0$ of single-port RAM bank P2. Write access logic 112 identifies the single-port RAM bank P0 as the spare memory bank from the retrieved write instance information (i.e., byte $B_4$ identifies physical bank P0). Note that single-port RAM bank P4 is no longer the spare memory bank for entry $E_1$, due to the previous collision described above in connection with FIGS. 6A-6C. Write access logic 112 writes the data value DATA6 of this write access to entry $E_1$ of the identified spare single-port RAM bank P0. The read access from single-port RAM bank P2 may be performed in parallel with the write access to single-port RAM bank P0, because no collision exists for these accesses.

As illustrated in FIG. 8C, the contents of L2P memory mapping SRAMs 121-122 are updated to properly reflect the resolution of the collision. More specifically, entries $E_1$ of L2P memory mapping SRAMs 121 are 122 are updated such that byte $B_2$ of these entries stores a value of '0', and byte $B_4$ of these entries stores a value of '2'. This update properly reflects the fact that a subsequent read access to entry $E_1$ of logical memory bank L2 should be mapped to single-port RAM bank P0 (note that data value DATA6 is stored in entry $E_1$ of bank P0). This update also properly reflects the fact that single-port RAM bank P2 has now become the spare memory bank for entry $E_1$.

Figure 9A:
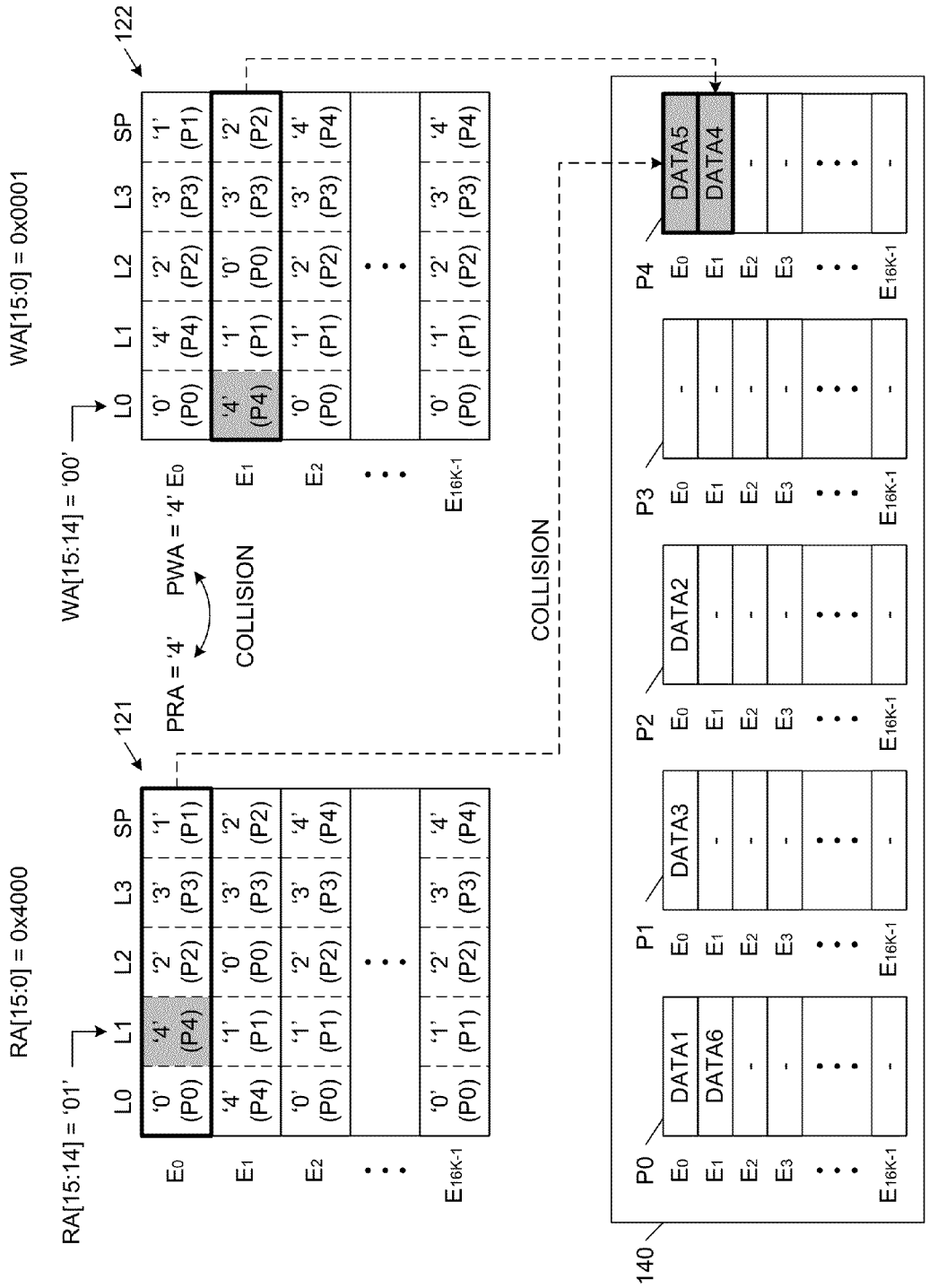
FIGS. 9A, 9B and 9C are block diagrams that illustrate the contents of L2P memory mapping SRAMs and single-port RAM banks of the two-port memory of FIG. 1 during the processing of a fourth colliding pair of read and write accesses.
Figure 9B:
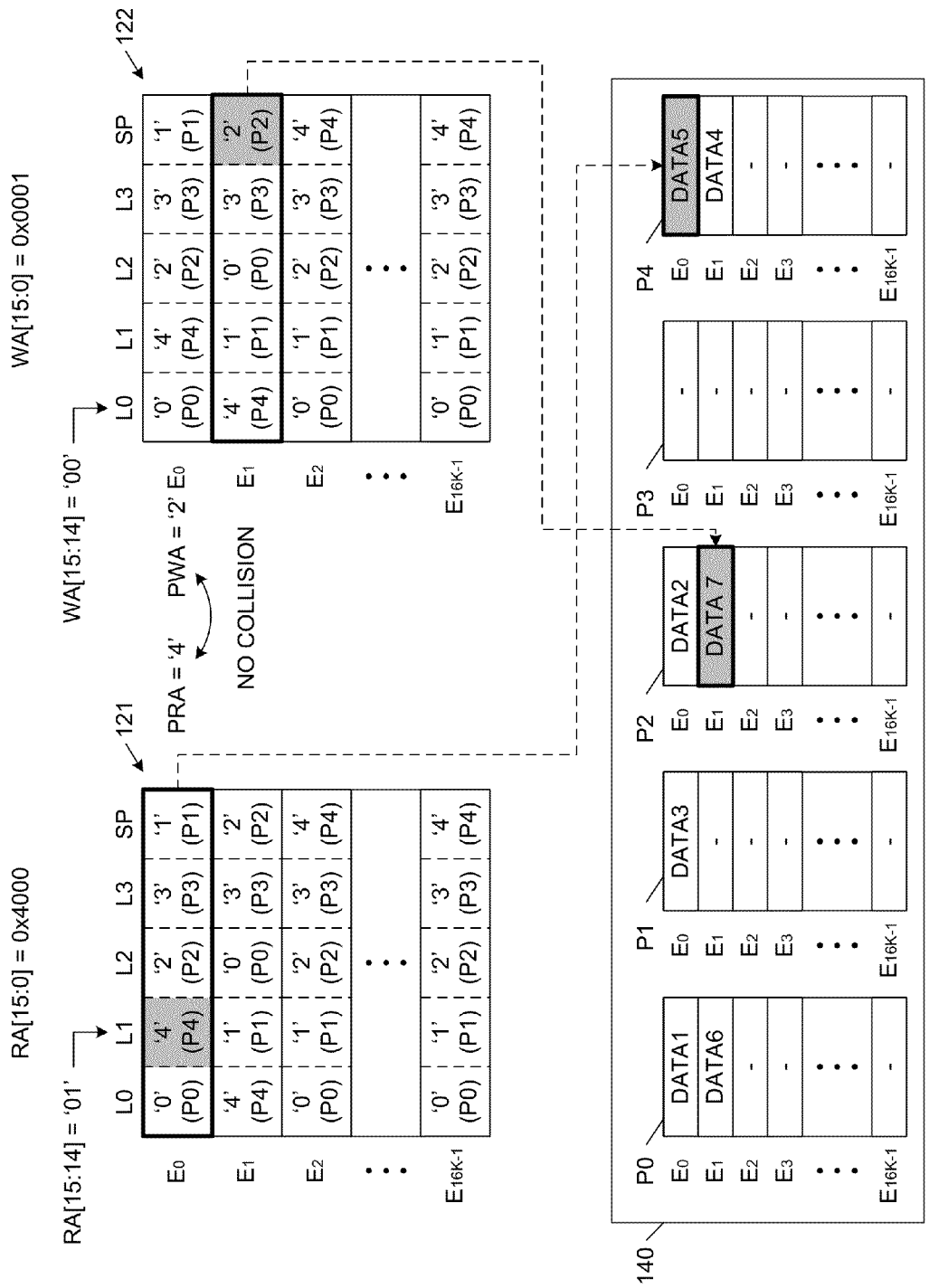
Figure 9C:
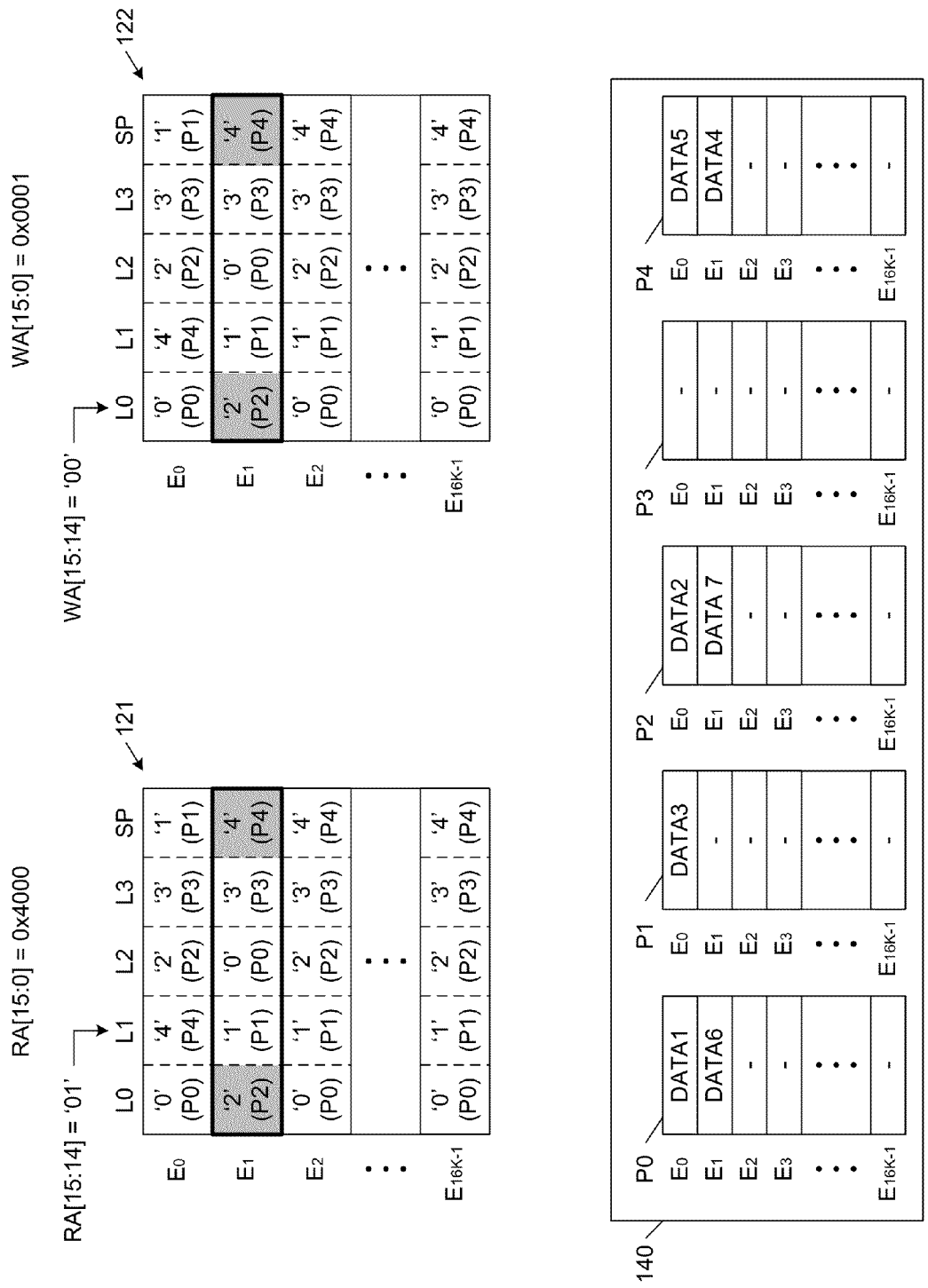

FIGS. 9A-9C are block diagrams that illustrate L2P memory mapping SRAMs 121-122 and single-port RAM banks P0-P4, for a read access to logical read address 0x4000 and a simultaneous write access to logical write address 0x0001. As illustrated in FIG. 9A, read access logic 111 retrieves the read instance information from entry $E_0$ of L2P memory mapping SRAM 121 in response to the logical read entry address RA[13:0]. Read access logic 111 decodes this retrieved entry $E_0$ to determine that the read access specifies single-port RAM bank P4 (i.e., logical read address RA[15: 14]='01'=logical memory bank L1=byte $B_1$=physical bank P4).

Similarly, write access logic 112 retrieves the write instance information from entry $E_1$ of L2P memory mapping SRAM 122 in response to the logical write entry address WA[13:0]. Write access logic 112 decodes this retrieved entry $E_1$ to determine that the write access specifies single-port RAM bank P4 (i.e., logical write address WA[15:14]= '00'=logical memory bank L0=byte $B_0$=physical bank P4). Collision logic 130 determines that a collision exists between the read and write accesses. Note that this particular pair of read and write accesses would not have resulted in a collision immediately after initialization of memory system 100. However, the dynamic re-mapping of the spare memory bank results in the present collision.

As illustrated in FIG. 9B, the read access has a higher priority when there is a collision, so read access logic 111 is allowed to read the data value DATA5 from entry $E_0$ of single-port RAM bank P4. Write access logic 112 identifies the single-port RAM bank P2 as the spare memory bank from the retrieved write instance information (i.e., byte $B_4$ indicates bank P2). Write access logic 112 then writes the data value DATA7 of the write access to entry $E_1$ of this spare single-port RAM bank P2. The read access from single-port RAM bank P4 may be performed in parallel with the write access to single-port RAM bank P2, because no collision exists for these accesses.

As illustrated in FIG. 9C, the contents of L2P memory mapping SRAMs 121-122 are updated to properly reflect the resolution of the collision. More specifically, entries $E_1$ of L2P memory mapping SRAMs 121 are 122 are updated such that byte $B_0$ of these entries stores a value of '2', and byte $B_4$ of these entries stores a value of '4'. This update properly reflects the fact that a subsequent read access to entry $E_1$ of logical memory bank L0 should be mapped to single-port RAM bank P2 (note that data value DATA7 is stored in entry $E_1$ of bank P2). This update also properly reflects the fact that single-port RAM bank P4 has now become the spare memory bank for entry $E_1$.

In accordance with the above-described method, any sequence of simultaneous read and write accesses specified on ports 101 and 102 may be implemented by two-port memory system 100.

One advantage of two-port memory system 100, with respect to a two-port memory system implemented entirely with two-port memories, is reduced layout area. However, the 2-port L2P memory mapping SRAMs 121-122 may require a significant layout area within memory system 100. In one variation of the above described embodiments, the width of the instance information stored in L2P memory mapping SRAMs 121 and 122 is reduced by encoding this instance information. As described above, each entry stored in SRAMs 121-122 stores 5 physical memory addresses, which range from '0' to '4'. Any logical memory bank L0-L3 can be mapped to any physical memory bank P0-P4, and the mapping is always unique (i.e., each logical memory bank is mapped to a unique physical memory bank). Consequently, the total number of combinations for five physical memory banks would be equal to 5×4×3×2×1, or 120. These 120 combinations can be represented using only 7 bits of instance information (i.e., 7 bits may represent up to 128 combinations). In one embodiment, logic is provided in read access logic 111 and write access logic 112 to decode the 7-bit instance information. Reducing the width of the 2-port L2P memory mapping SRAMs 121 and 122 in this manner would advantageously further reduce the required layout area of memory system 100.

In accordance with another variation of the present invention, each entry of the L2P memory mapping SRAMs 121-122 is protected with a corresponding error correction code (ECC). For example, the ECC scheme may provide the capability of correcting a single bit error and detecting a double bit error. In one embodiment, a plurality of entries of SRAMS 121-122 are combined, and ECC bits are generated for the combined entries, thereby reducing the number of ECC bits required to be stored by SRAMs 121-122. For example, four entries (4 entries×7 bits/entry=28 bits) can be combined, and these four entries can be protected by 7 bits of ECC. Sharing ECC bits with a plurality of entries further reduces the required capacity of the 2-port L2P memory mapping SRAMs 121 and 122, thereby advantageously further reducing the required layout area of memory system 100.

The area savings realized by memory system 100, when compared with a 2-port SRAM memory system of the same capacity, can be summarized as follows. Assume that the area of each of the 1-port RAM banks P0-P4 (each having a capacity of 16K×256) is equal to Y, and that the area of the two 2-port L2P memory mapping SRAMs 121 and 122 (each of which implements instance information encoding and ECC sharing as described above) is Y. In this case, the area of memory system 100 would be approximately 6Y (i.e., 5Y+Y). Further assume that the area of a 2-port SRAM with a capacity of 16K×256 is 4Y. In this case, the area of a 2-port 64K×256 memory system implemented using only 2-port SRAMs would be approximately 16Y (i.e., 4×4Y). Thus, the area savings realized by memory system 100 would be about 10Y (i.e., 16Y−6Y), or about 62.5% (i.e., 10Y/16Y=62.5%). Memory system 100 therefore realizes a significant area savings compared to a conventional 2-port memory system.

Although the present invention has been described in connection with various embodiments, it is understood that variations of these embodiments would be obvious to one of ordinary skill in the art. Thus, the present invention is limited only by the following claims.

We claim:

1. A two port memory comprising:
   N single-port memory banks, each having M entries, wherein N is an integer greater than two;
   a read mapping memory associated with a read port of the two-port memory, wherein the read mapping memory includes M entries, each storing read instance information that maps N−1 logical memory banks and a spare memory bank to the N single-port memory banks; and
   a write mapping memory associated with a write port of the two-port memory, wherein the write mapping memory includes M entries, each storing write instance information that maps the N−1 logical memory banks and the spare memory bank to the N single-port memory banks.

2. The two-port memory of claim 1, wherein the read instance information stored in the read mapping memory is identical to the write instance information stored in the write mapping memory.

3. The two-port memory of claim 1, wherein the N single-port memory banks are identical.

4. The two-port memory of claim 1, wherein the N single-port memory banks are dynamic random access memory (DRAM) banks.

5. The two-port memory of claim 1, wherein each of the M entries of the read mapping memory is associated with a corresponding one of the M entries in each of the N single-port memory banks.

6. The two-port memory of claim 5, wherein each of the M entries of the write mapping memory is associated with a corresponding one of the M entries in each of the N single-port memory banks.

7. The two-port memory of claim 1, wherein the read mapping memory is a two-port memory having a read port and a write port, and wherein the write mapping memory is a two-port memory having a read port and a write port.

8. The two-port memory of claim 7, further comprising write access logic coupled to the write port of the two-port memory, the read port of the write mapping memory, the write port of the write mapping memory and the write port of the read mapping memory.

9. The two-port memory of claim 8, further comprising read access logic coupled to the read port of the two-port memory and the read port of the read mapping memory.

10. The two-port memory of claim 1, further comprising:
    read access logic that receives a read access request that includes a logical read bank address that identifies one of N−1 logical banks and a read entry address that identifies one of the entries of the read mapping memory, wherein the read access logic retrieves read instance information from the entry of the read mapping memory identified by the read entry address, and in response, maps the logical read bank address to a physical read bank address that specifies one of the N single-port memory banks; and
    write access logic that receives a write access request that includes a logical write bank address that identifies one of the N−1 logical banks and a write entry address that identifies one of the entries of the write mapping memory, wherein the write access logic retrieves write instance information from the entry of the write mapping memory identified by the write entry address, and in response, maps the logical write bank address to a physical write bank address that specifies one of the N single-port memory banks.

11. The two-port memory of claim 10, further comprising comparison logic that compares the physical read bank address with the physical write bank address to determine whether a match exists.

12. The two-port memory of claim 11, wherein the write access logic is coupled to the comparison logic, wherein the write access logic uses the retrieved write instance information to translate the physical write bank address to a spare bank address if the comparison logic determines a match exists.

13. The two-port memory of claim 12, wherein the write access logic is coupled to the read mapping memory and the write mapping memory, wherein the write access logic updates write instance information in the write mapping memory and read instance information in the read mapping memory if the comparison logic determines a match exists.

14. A two-port memory comprising
N single-port memory banks, each having a plurality of entries, wherein N is an integer greater than two, wherein the N single-port memory banks implement N−1 logical memory banks and a spare memory bank;
a read mapping memory having a plurality of entries, each storing read instance information that maps the N−1 logical memory banks and the spare memory bank to the N single-port memory banks for N corresponding entries in the N single-port memory banks; and
a write mapping memory having a plurality of entries, each storing write instance information that maps the N−1 logical memory banks and the spare memory bank to the N single-port memory banks for N corresponding entries in the N single-port memory banks.

15. The two-port memory of claim 14, wherein the read instance information stored in the read mapping memory is identical to the write instance information stored in the write mapping memory.

16. The two-port memory of claim 14, further comprising:
read access logic that receives a read access request that includes a logical read bank address that identifies one of N−1 logical banks and a read entry address that identifies one of the entries of the read mapping memory, wherein the read access logic retrieves read instance information from the entry of the read mapping memory identified by the read entry address, and in response, maps the logical read bank address to a physical read bank address that specifies one of the N single-port memory banks; and
write access logic that receives a write access request that includes a logical write bank address that identifies one of the N−1 logical banks and a write entry address that identifies one of the entries of the write mapping memory, wherein the write access logic retrieves write instance information from the entry of the write mapping memory identified by the write entry address, and in response, maps the logical write bank address to a physical write bank address that specifies one of the N single-port memory banks.

17. The two-port memory of claim 16, further comprising comparison logic that compares the physical read bank address with the physical write bank address to determine whether a match exists.

18. The two-port memory of claim 17, wherein the write access logic is coupled to the comparison logic, wherein the write access logic uses the retrieved write instance information to translate the physical write bank address to a spare bank address if the comparison logic determines a match exists.

19. The two-port memory of claim 18, wherein the write access logic is coupled to the read mapping memory and the write mapping memory, wherein the write access logic updates write instance information in the write mapping memory and read instance information in the read mapping memory if the comparison logic determines a match exists.

20. A method of implementing a two-port memory comprising:
storing data in a physical memory having N single-port memory banks, each having M entries, wherein N is an integer greater than two;
maintaining a read mapping memory associated with a read port of the two-port memory, wherein the read mapping memory includes M entries, each storing read instance information that maps N−1 logical memory banks and a spare memory bank to the N single-port memory banks; and
maintaining a write mapping memory associated with a write port of the two-port memory, wherein the write mapping memory includes M entries, each storing write instance information that maps the N−1 logical memory banks and the spare memory bank to the N single-port memory banks.

21. The method of claim 20, further comprising:
receiving a read access request on the read port, the read access request including a logical read bank address and a read entry address;
retrieving read instance information from the read mapping memory using the read entry address to address the read mapping memory; and
using the retrieved read instance information to map the logical read bank address to a physical read bank address that specifies one of the N single-port memory banks.

22. The method of claim 21, further comprising:
receiving a write access request on the write port, the write access request including a logical write bank address and a write entry address;
retrieving write instance information from the write mapping memory using the write entry address to address the write mapping memory; and
using the retrieved write instance information to map the logical write bank address to a physical write bank address that specifies one of the N single-port memory banks.

23. The method of claim 22, further comprising determining whether the physical read bank address matches the physical write bank address.

24. The method of claim 23, further comprising performing the following steps if the physical read bank address matches the physical write bank address:
using the retrieved write instance information to re-map the physical write bank address to a spare bank address that specifies one of the N single-port memory banks; and
performing a write access to the one of the N single-port memory banks specified by the spare bank address, at an entry specified by the write entry address, and in parallel, performing a read access the one of the N single-port memory banks specified by the physical read bank address, at an entry specified by the read entry address.

25. The method of claim 23, further comprising performing the following steps if the physical read bank address matches the physical write bank address:

modifying the retrieved write instance information, thereby creating modified instance information;

writing the modified instance information to the write mapping memory, at an address specified by the write entry address; and writing the modified instance information to the read mapping memory, at an address specified by the write entry address.

26. The method of claim 23, further comprising performing the following steps if the physical read bank address does not match the physical write bank address:

performing a write access to the one of the N single-port memory banks specified by the physical write bank address, at an entry specified by the write entry address; and in parallel, performing a read access the one of the N single-port memory banks specified by the physical read bank address, at an entry specified by the read entry address.

27. A method of implementing a two-port memory comprising:

receiving a read access request on a read port, the read access request including a logical read bank address and a read entry address;

retrieving read instance information from a read mapping memory in response to the read entry address, wherein the read instance information maps a plurality of logical read bank addresses, including the logical read bank address, and a spare bank address to a plurality of physical read bank addresses;

receiving a write access request on a write port, the write access request including a logical write bank address and a write entry address;

retrieving write instance information from a write mapping memory in response to the write entry address, wherein the write instance information maps a plurality of logical write bank addresses, including the logical write bank address, and a spare bank address to a plurality of physical write bank addresses; and comparing a physical read bank address mapped to the logical read bank address to a physical write bank address mapped to the logical write bank address to determine whether a match exists.

28. The method of claim 27, wherein if a match does not exist, then performing a read access to an entry of a first single-port memory bank specified by the read entry address and the physical read bank address, and in parallel, performing a write access to an entry of a second single-port memory bank specified by the write entry address and the physical write bank address.

29. The method of claim 27, further comprising maintaining the read and write mapping memories such that the read instance information is identical to the write instance information.

30. The method of claim 27, wherein if a match exists, then
translating the physical write bank address to the spare bank address in response to the write instance information; and performing a read access to an entry of a first single-port memory bank specified by the read entry address and the physical read bank address, and in parallel, performing a write access to an entry of a second single-port memory bank specified by the write entry address and the spare bank address.

31. The method of claim 27, wherein if a match exists, then updating the retrieved write instance information.

32. The method of claim 31, wherein the retrieved write instance information is updated such that the physical write bank address is mapped to the spare bank address.

33. The method of claim 32, further comprising updating the retrieved read instance information such that the physical read bank address is mapped to the spare bank address.

* * * * *